(12) United States Patent
Hu et al.

(10) Patent No.: US 12,181,631 B2
(45) Date of Patent: Dec. 31, 2024

(54) OPTICAL ELEMENT DRIVING MECHANISM

(71) Applicant: TDK TAIWAN CORP, Taoyuan (TW)

(72) Inventors: Chao-Chang Hu, Taoyuan (TW); Chen-Hsien Fan, Taoyuan (TW); Yueh-Lin Lee, Taoyuan (TW)

(73) Assignee: TDK TAIWAN CORP., Taoyuan (TW)

( * ) Notice: Subject to any disclaimer, the term of this patent is extended or adjusted under 35 U.S.C. 154(b) by 480 days.

(21) Appl. No.: 17/554,644

(22) Filed: Dec. 17, 2021

(65) Prior Publication Data
US 2022/0197046 A1 Jun. 23, 2022

Related U.S. Application Data

(60) Provisional application No. 63/127,746, filed on Dec. 18, 2020.

(51) Int. Cl.
| | |
|---|---|
| *G02B 7/04* | (2021.01) |
| *G02B 7/09* | (2021.01) |
| *G02B 13/00* | (2006.01) |
| *G02B 26/00* | (2006.01) |
| *G02B 26/08* | (2006.01) |
| *G02B 27/64* | (2006.01) |
| *G06F 3/01* | (2006.01) |
| *H04N 23/54* | (2023.01) |
| *H04N 23/57* | (2023.01) |
| *H10N 30/00* | (2023.01) |
| *H10N 30/80* | (2023.01) |

(52) U.S. Cl.
CPC ......... *G02B 13/0015* (2013.01); *G02B 7/04* (2013.01); *G02B 7/09* (2013.01); *G02B 26/00* (2013.01); *G02B 26/0875* (2013.01); *G02B 27/64* (2013.01); *G02B 27/646* (2013.01); *G06F 3/016* (2013.01); *H04N 23/54* (2023.01); *H04N 23/57* (2023.01); *H10N 30/101* (2024.05); *H10N 30/802* (2023.02)

(58) Field of Classification Search
CPC ........ G02B 13/0015; G02B 7/04; G02B 7/09; G02B 26/00; G02B 26/0875; G02B 27/64; G02B 27/646; G06F 3/016; H10N 30/101; H10N 30/802; G03B 5/00; G03B 13/36
USPC ........................................................ 359/557
See application file for complete search history.

(56) References Cited

U.S. PATENT DOCUMENTS

| | | | | |
|---|---|---|---|---|
| 8,078,042 B2 * | 12/2011 | Hagiwara | ............ | G02B 27/646 |
| | | | | 359/557 |
| 11,703,658 B2 * | 7/2023 | Chang | .................. | G02B 27/646 |
| | | | | 359/557 |
| 11,789,243 B2 * | 10/2023 | Chen | .................. | G02B 13/0065 |
| | | | | 359/557 |

(Continued)

*Primary Examiner* — William R Alexander
(74) *Attorney, Agent, or Firm* — MUNCY, GEISSLER, OLDS & LOWE, P.C.

(57) ABSTRACT

An optical element driving mechanism is provided. The optical element driving mechanism includes a movable portion, a fixed portion, and a driving assembly. The movable portion is used for connecting to a first optical element having an optical axis. The movable portion is movable relative to the fixed portion. The driving assembly is used for driving the movable portion to move relative to the fixed portion. When viewed along the optical axis, the optical element driving mechanism is strip-shaped.

10 Claims, 22 Drawing Sheets

(56) References Cited

U.S. PATENT DOCUMENTS

| | | | |
|---|---|---|---|
| 2010/0195996 A1* | 8/2010 | Hagiwara | G03B 5/02 |
| | | | 396/85 |
| 2013/0100325 A1* | 4/2013 | Wada | G02B 15/142 |
| | | | 359/557 |
| 2014/0218798 A1* | 8/2014 | Suzuka | G02B 13/0015 |
| | | | 359/557 |
| 2014/0218799 A1* | 8/2014 | Suzuka | G02B 13/0065 |
| | | | 359/557 |
| 2015/0109485 A1* | 4/2015 | Ozaki | G02B 27/646 |
| | | | 359/557 |
| 2016/0062136 A1* | 3/2016 | Nomura | H04N 23/60 |
| | | | 359/557 |
| 2016/0154250 A1* | 6/2016 | Miller | G02B 7/09 |
| | | | 359/557 |
| 2016/0154251 A1* | 6/2016 | Ladwig | G02B 7/023 |
| | | | 359/557 |
| 2016/0154252 A1* | 6/2016 | Miller | G02B 7/02 |
| | | | 359/557 |
| 2016/0187614 A1* | 6/2016 | Shih | G02B 27/646 |
| | | | 359/557 |
| 2021/0199912 A1* | 7/2021 | Hu | G02B 7/20 |
| 2022/0082786 A1* | 3/2022 | Chang | G02B 7/08 |
| 2022/0137427 A1* | 5/2022 | Liu | G03B 5/00 |
| | | | 359/557 |
| 2022/0308319 A1* | 9/2022 | Chen | G02B 13/0065 |
| 2023/0296962 A1* | 9/2023 | Lee | G03B 17/17 |
| | | | 359/557 |

* cited by examiner

OPTICAL ELEMENT DRIVING MECHANISM

CROSS REFERENCE TO RELATED APPLICATIONS

This application claims the benefit of U.S. Provisional Application No. 63/127,746, filed on Dec. 18, 2020, the entirety of which is incorporated by reference herein.

BACKGROUND OF THE INVENTION

Field of the Invention

The present disclosure relates to an optical element driving mechanism.

Description of the Related Art

As technology has developed, it has become more common to include image-capturing and video-recording functions into many types of modern electronic devices, such as smartphones and digital cameras. These electronic devices are used more and more often, and new models have been developed that are convenient, thin, and lightweight, offering more choice to consumers.

Electronic devices that have image-capturing or video-recording functions normally include a driving mechanism to drive an optical element (such as a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the driving mechanism and how to increase its durability has become an important issue.

BRIEF SUMMARY OF THE INVENTION

An optical element driving mechanism is provided in some embodiments. The optical element driving mechanism includes a movable portion, a fixed portion, and a driving assembly. The movable portion is used for connecting to a first optical element having an optical axis. The movable portion is movable relative to the fixed portion. The driving assembly is used for driving the movable portion to move relative to the fixed portion. When viewed along the optical axis, the optical element driving mechanism is strip-shaped.

In some embodiments, the optical element driving mechanism is used for disposing on an optical system, the optical system is used for receiving light passing along a first axis, and the first axis and the optical axis are not parallel. The fixed portion includes a first case and a first bottom. The first case includes a first top wall and a first side wall. The first top wall is plate-shaped. The first side wall is plate-shaped and perpendicular to the first top wall. The first bottom includes a first bottom plate, wherein the first bottom plate is plate-shaped and parallel to the first top wall. The first top wall is adjacent to a first optical module, and the second optical module includes a second case and a second bottom. The second case includes a second top wall and a second side wall. Therein the second top wall is plate-shaped. The second side wall is plate-shaped and perpendicular to the second top wall. The second bottom includes a second bottom plate, wherein the second bottom plate is plate-shaped and parallel to the second top wall. A first surface of the first top wall faces the second side wall. The first top wall is parallel to the second side wall. A first opening of the first top wall is adjacent to the second side wall. A second opening of the second side wall is adjacent to the first top wall. The first opening is adjacent to the second opening. The maximum size of the first opening and the maximum size of the second opening in the first axis are different. A first accommodating space is formed by the first bottom and the first case and is used for accommodating the first optical element. The material of the first case includes metal. The material of the first bottom includes nonmetal. A second accommodating space is formed by the second bottom and the second case and is used for accommodating the second optical element. The material of the second case includes metal. The material of the second bottom includes nonmetal. The first bottom plate and the second bottom plate are not parallel.

In some embodiments, the optical element driving mechanism further includes a first circuit assembly electrically connected to the first optical element. The first circuit assembly includes a first segment extending along a second axis, a second segment extending along a third axis, a third segment extending along the second axis, a fourth segment extending along the third axis, a fifth segment extending along the second axis, a sixth segment extending along the third axis, and a seventh segment extending along the second axis. The first optical element is movably connected to the fixed portion through the first circuit assembly. The first circuit assembly surrounds the movable portion when viewed along the optical axis. The first segment is plate-shaped. The second segment is plate-shaped and is not parallel to the first segment. A gap is formed between the second segment and the movable portion. A gap is formed between the second segment and the fixed portion. The optical element driving mechanism extends along the second axis when viewed along the optical axis. The second axis and the third axis are perpendicular. The third segment is plate-shaped and is not parallel to the first segment. The third segment is not parallel to the second segment. A gap is formed between the third segment and the movable portion. A gap is formed between the third segment and the fixed portion. The fourth segment is plate-shaped and is not parallel to the third segment. A gap is formed between the fourth segment and the movable portion. A gap is formed between the fourth segment and the fixed portion. The fifth segment is plate-shaped and is not parallel to the fourth segment. A gap is formed between the fifth segment and the movable portion. A gap is formed between the fifth segment and the fixed portion. The sixth segment is plate-shaped and is not parallel to the fifth segment. A gap is formed between the sixth segment and the movable portion. A gap is formed between the sixth segment and the fixed portion. The seventh segment is plate-shaped and is not parallel to the sixth segment. A gap is formed between the seventh segment and the movable portion. A gap is formed between the seventh segment and the fixed portion. The seventh segment and the fifth segment are not parallel. The third axis and the first axis are parallel.

In some embodiments, the optical element driving mechanism further includes a first damping element used for absorbing the abnormal vibration of the movable portion relative to the fixed portion. The first damping element includes resin. The first damping element is in direct contact with the first circuit assembly. The optical element driving mechanism is polygonal, and the first damping element is positioned at a first corner of the optical element driving mechanism when viewed along the optical axis. The first damping element is in direct contact with the fixed portion.

The first damping element is in direct contact with a first bending portion of the first circuit assembly.

In some embodiments, the optical element driving mechanism further includes a second damping element used for absorbing the abnormal vibration of the movable portion relative to the fixed portion. The second damping element includes resin. The second damping element is in direct contact with the first circuit assembly. The second damping element is positioned at a first edge of the optical element driving mechanism when viewed along the optical axis. The second damping element is in direct contact with the movable portion. The second damping element is in direct contact with the third segment of the first circuit assembly.

In some embodiments, the optical element driving mechanism further includes a connecting assembly and a third damping element. The movable portion is movably connected to the fixed portion through the connecting assembly. The third damping element is used for absorbing the abnormal vibration of the movable portion relative to the fixed portion. The third damping element includes resin. The third damping element is in direct contact with the first circuit assembly. The third damping element is positioned at a second corner of the optical element driving mechanism when viewed along the optical axis. The third damping element is in direct contact with the connecting assembly. The third damping element is in direct contact with a second bending portion of the first circuit assembly.

In some embodiments, the driving assembly includes a first coil, a first magnetic element corresponding to the first coil, a second coil, a second magnetic element corresponding to the second coil, a third coil, and a third magnetic element corresponding to the third coil. The optical element driving mechanism further includes: a first sensing element used for detecting the movement of the movable portion relative to the fixed portion, a second sensing element used for detecting the movement of the movable portion relative to the fixed portion, and a third sensing element used for detecting the movement of the movable portion relative to the fixed portion. The first coil is strip-shaped when viewed along a coil axis of the first coil. The first coil extends along the second axis when viewed along the coil axis of the first coil. The center of the first magnetic element does not overlap the center of the first optical element when viewed along the optical axis. The first coil and the first magnetic element are used for generating a first driving force. The coil axis of the first coil is parallel to the coil axis of the second coil. The second coil is strip-shaped when viewed along the coil axis of the second coil. The first coil and the second coil extend in different directions when viewed along the coil axis of the second coil. The second coil extends along the third axis when viewed along the coil axis of the second coil. The second coil and the second magnetic element are used for generating a second driving force. The third coil is strip-shaped when viewed along the coil axis of the third coil. The third coil extends along the second axis when viewed along the coil axis of the third coil. The coil axis of the third coil and the coil axis of a first coil are parallel. The first coil and the third coil are arranged along the second axis when viewed along the coil axis of the third coil. The center of the third magnetic element and the center of the first optical element do not overlap each other. The third coil and the third magnetic element are used for generating a third driving force. The direction of the first driving force is parallel to the direction of the third driving force. The direction of the first driving force is perpendicular to the direction of the second driving force. The direction of the first driving force is parallel to the third axis. The direction of the second driving force is parallel to the second axis. The first coil surrounds the first sensing element. The first sensing element is used for detecting the linear movement of the movable portion relative to the fixed portion. The second coil surrounds the second sensing element. The second sensing element is used for detecting the linear movement of the movable portion relative to the fixed portion. The third coil surrounds the third sensing element. The third sensing element is used for detecting the linear movement of the movable portion relative to the fixed portion. The first sensing element and the third sensing element are arranged along the second axis when viewed along the optical axis. The first sensing element and the third sensing element are used for detecting the rotational movement of the movable portion relative to the fixed portion.

In some embodiments, the direction of the first driving force is opposite to the direction of the third driving force. The first optical element is between the first opening and the first coil in the direction that the optical axis extends. The distance between the center of the first magnetic element and the center of the first optical element is greater than the distance between the center of the second magnetic element and the center of the first optical element when viewed along the optical axis. The first magnetic element and the second magnetic element are arranged along the second axis when viewed along the optical axis. The first optical element is disposed between the driving assembly and the first opening in the direction that the optical axis extends. The first coil at least partially overlaps the second coil in the direction that the second axis extends.

In some embodiments, the center of the second magnetic element and the center of the optical element do not overlap each other. The driving assembly further includes a fourth coil and a fourth magnetic element, and the fourth magnetic element corresponds to the fourth coil. The coil axis of the fourth coil is parallel to the coil axis of the second coil. The fourth coil is strip-shaped when viewed along the coil axis of the fourth coil. The first coil and the fourth coil extend in different directions when viewed along the coil axis of the fourth coil. The fourth coil extends along the third axis when viewed along the coil axis of the fourth coil. The fourth coil and the fourth magnetic element are used for generating a fourth driving force. The direction of the fourth driving force and the direction of the second driving force are parallel. The center of the first optical axis is between the first magnetic element and the third magnetic element. The center of the first optical axis is between the second magnetic element and the fourth magnetic element.

In some embodiments, the fourth coil is between the first optical element and the first opening in the direction that the optical axis extends. The first optical element is between the first opening and the first coil in the direction that the optical axis extends. The first optical element is between the first coil and the third coil in the direction that the second axis extends. The first coil does not overlap the fourth coil in the direction that the second axis extends. The first magnetic element and the fourth magnetic element do not overlap each other in the direction that the second axis extends.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
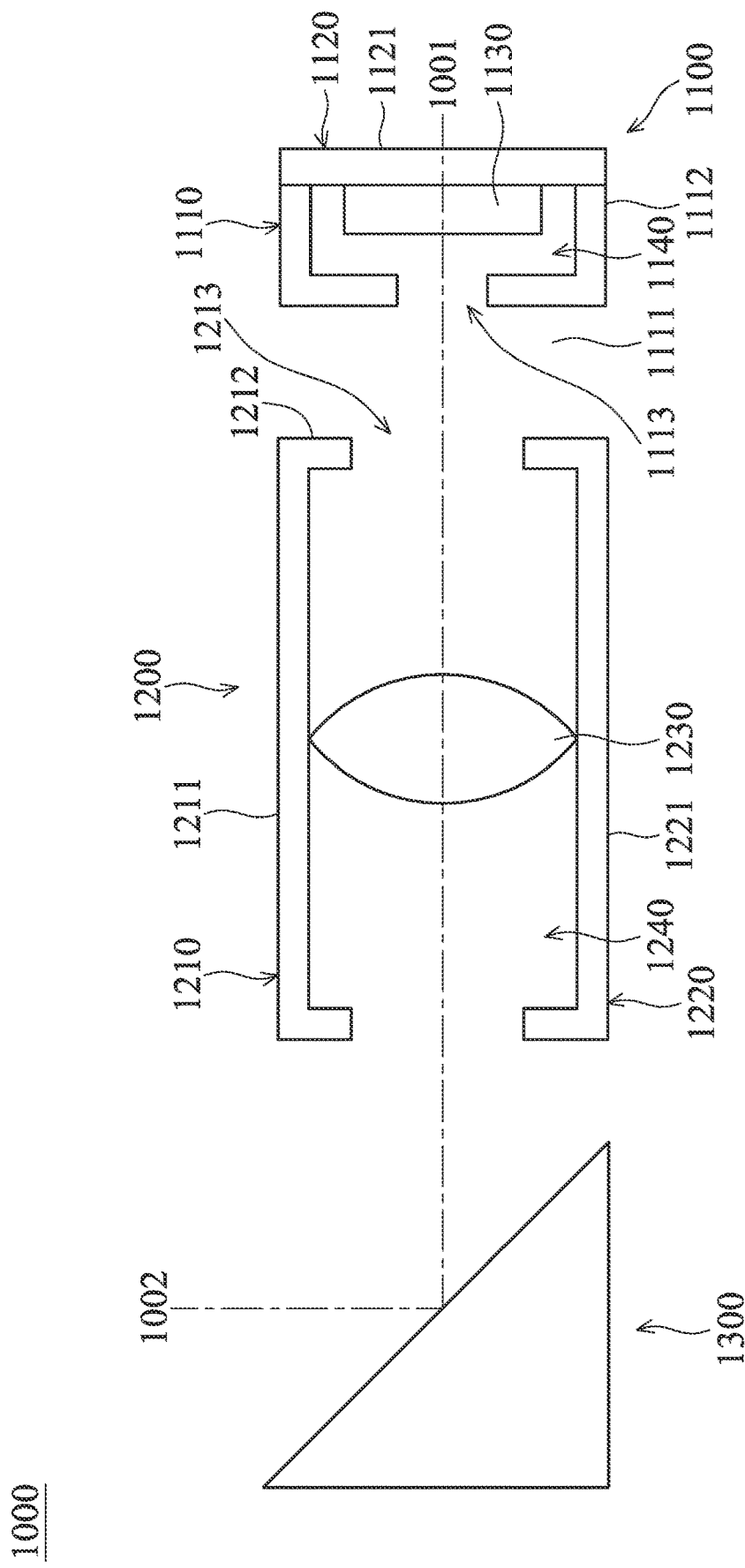
FIG. 1 is a schematic view of an optical system in some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, in some embodiments, the formation of a first feature over or on a second feature in the description that follows may include embodiments in which the first and second features are in direct contact, and may also include embodiments in which additional features may be disposed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

FIG. 1 is a schematic view of an optical system 1000 in some embodiments of the present disclosure. The optical system 1000 may be a periscope image capturing module, and may mainly include an optical element driving mechanism 1100, a first optical module 1200, and a light path adjusting element 1300. The optical element driving mechanism 1100 may include a first case 1110 and a first bottom 1120. The first case 1110 and the first bottom 1120 may form a first accommodating space 1140 used for accommodating a first optical element 1130. In some embodiments, the material of the first case 1110 may include metal, and the material of the first bottom 1120 may include nonmetal, such as plastic, etc.

The first optical element 1130 may be an image sensor, and may have an optical axis 1001 that is perpendicular to the surface of the first optical element 1130. The optical element driving mechanism 1100, the first optical module 1200, and the light path adjusting element 1300 may arrange along the optical axis 1001 in sequence. In some embodiments, the first case 1110 and the first bottom 1120 may be called as a fixed portion, the first optical element 1130 may be disposed on a movable portion (not shown), and a driving assembly (not shown) may be disposed in the optical element driving mechanism 1100 to allow the first optical element 1130 to move relative to the fixed portion, so auto focus or optical image stabilization may be achieved.

The first optical element 1130 may be a lens, a mirror, a prism, a beam splitter, an aperture, a liquid lens, an image sensor, a camera module, or a ranging module. It should be noted that the definition of the optical element is not limited to the element that is related to visible light, and other elements that relate to invisible light (e.g. infrared or ultraviolet) are also included in the present disclosure.

In some embodiments, the optical system 1000 may be used for receiving light passing along a first axis 1002, and the first axis 1002 and the optical axis 1001 are not parallel, such as may be tilted or perpendicular. For example, the light passing along the first axis 1002 may achieve the light path adjusting element 1300, and then the direction of the light may be adjusted by the light path adjusting element 1300. In some embodiments, the light path adjusting element 1300 may be a mirror, a prism, or a beam splitter. Therefore, the light may change its direction to pass along the optical axis 1001.

The first case 1110 may include a first top wall 1111 and a first side wall 1112. The first top wall 1111 is plate-shaped. The first side wall 1112 is plate-shaped and is perpendicular to the first top wall 1111. The first bottom 1120 may include a first bottom plate 1121. The first bottom plate 1121 is plate-shaped and is parallel to the first top wall 1111. The first top wall 1111 is adjacent to the first optical module 1200. The first optical module 1200 may include a second case 1210 and a second bottom 1220 The second case 1210 and the second bottom 1220 may form a second accommodating space 1240 used for accommodating the second optical element 1230. In some embodiments, the material of the second case 1210 may include metal, and the material of the second bottom 1220 may include nonmetal, such as plastic. The second optical element 1230 may be a lens, an aperture, or a liquid lens, to allow the light passing through the second optical element 1230 to reach the first optical element 1130.

The second case 1210 may include a second top wall 1211 and a second side wall 1212. The second top wall 1211 is plate-shaped. The second side wall 1212 is plate-shaped and is perpendicular to the second top wall 1211. The second bottom 1220 may include a second bottom plate 1221. The second bottom plate 1221 is plate-shaped and is parallel to the second top wall 1211, and is not parallel to the first bottom plate 1121. It should be noted that the first top wall 1111 may face the second side wall 1212, and the first top wall 1111 may be parallel to the second side wall 1212. A first opening 1113 may form on the first top wall 1111, a second opening 1213 may form on the second side wall 1212, the first opening 1113 is adjacent to the second side wall 1212, and the second opening 1213 is adjacent to the first top wall 1111. In other words, the first opening 1113 may be adjacent to the second opening 1213 to allow the light passing through the first opening 1113 and the second opening 1213 to reach the first optical element 1130. In some embodiments, the maximum size of the first opening 1113 and the second opening 1213 in the optical axis 1001 may be different for different light paths.

Figure 2A:
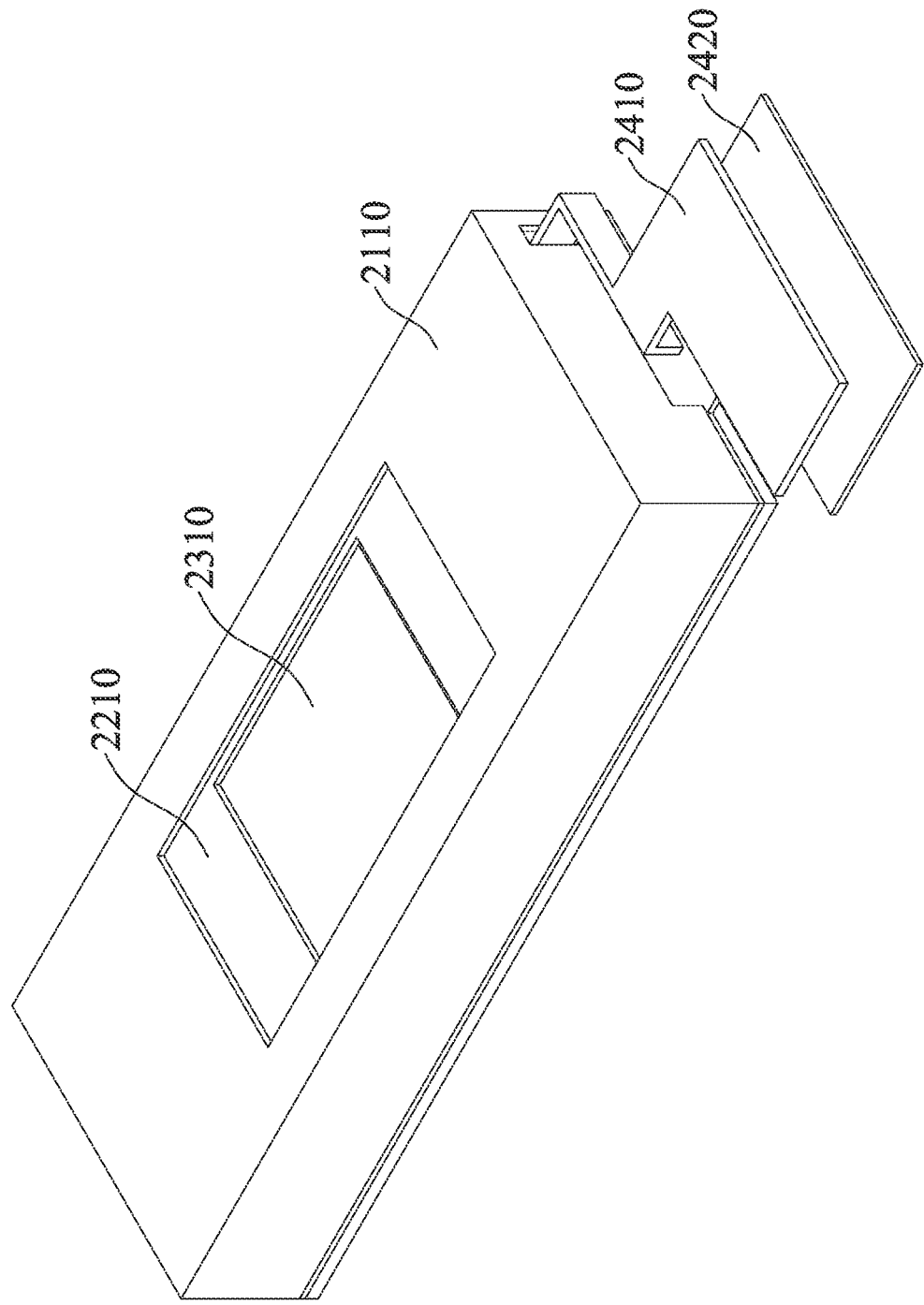
FIG. 2A is a schematic view of an optical element driving mechanism.
Figure 2B:
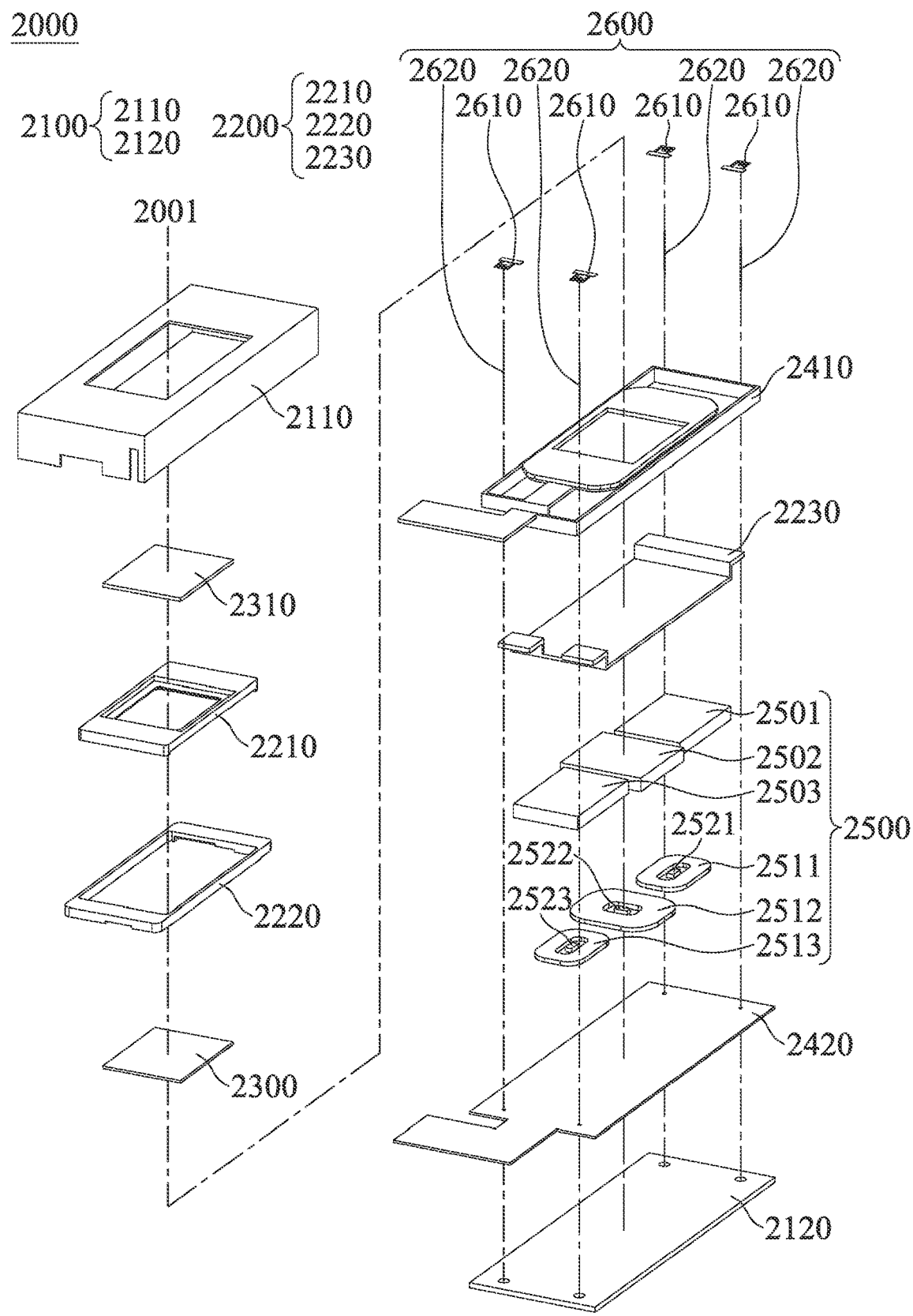
FIG. 2B is an exploded view of the optical element driving mechanism.
Figure 2C:
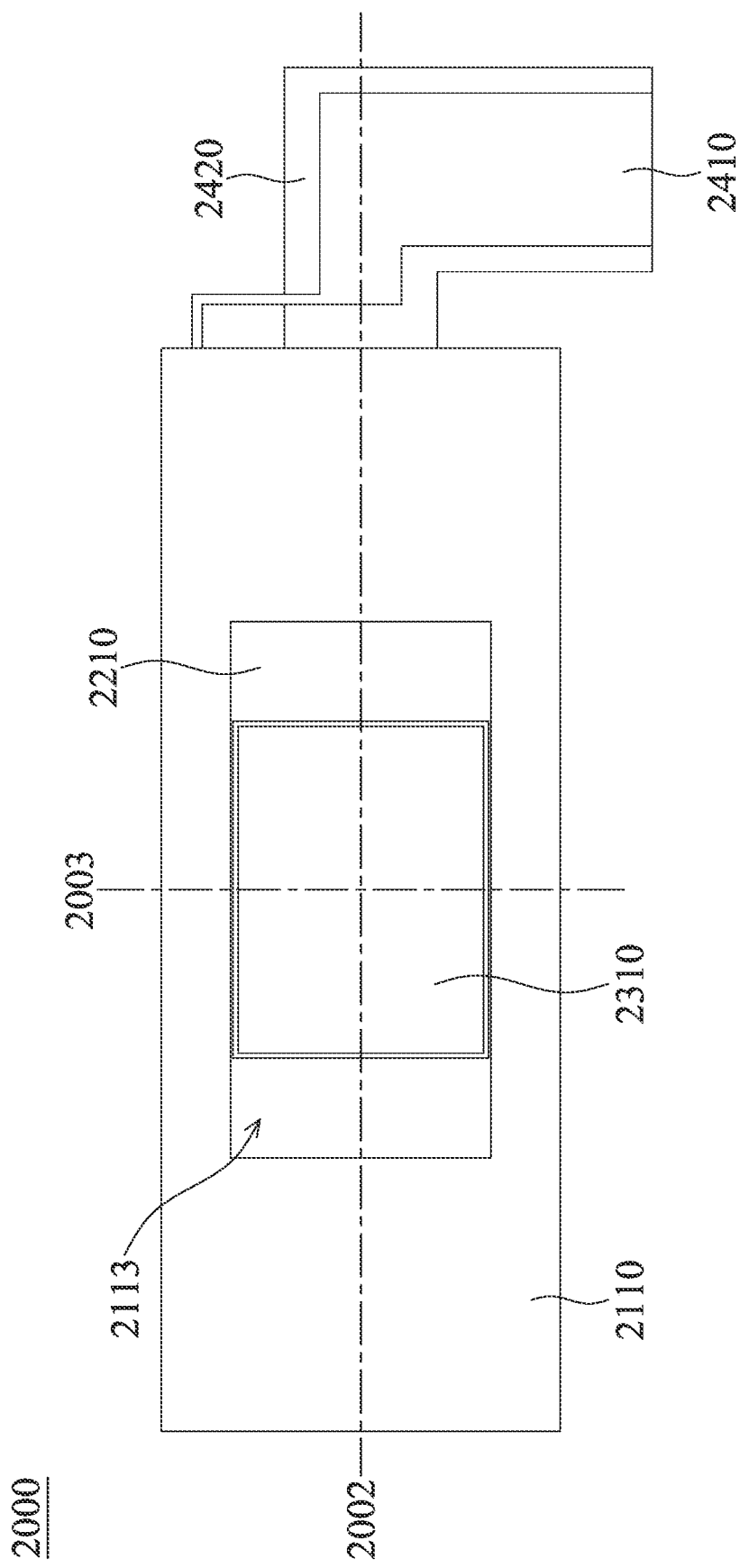
FIG. 2C is a top view of the optical element driving mechanism.
Figure 2D:
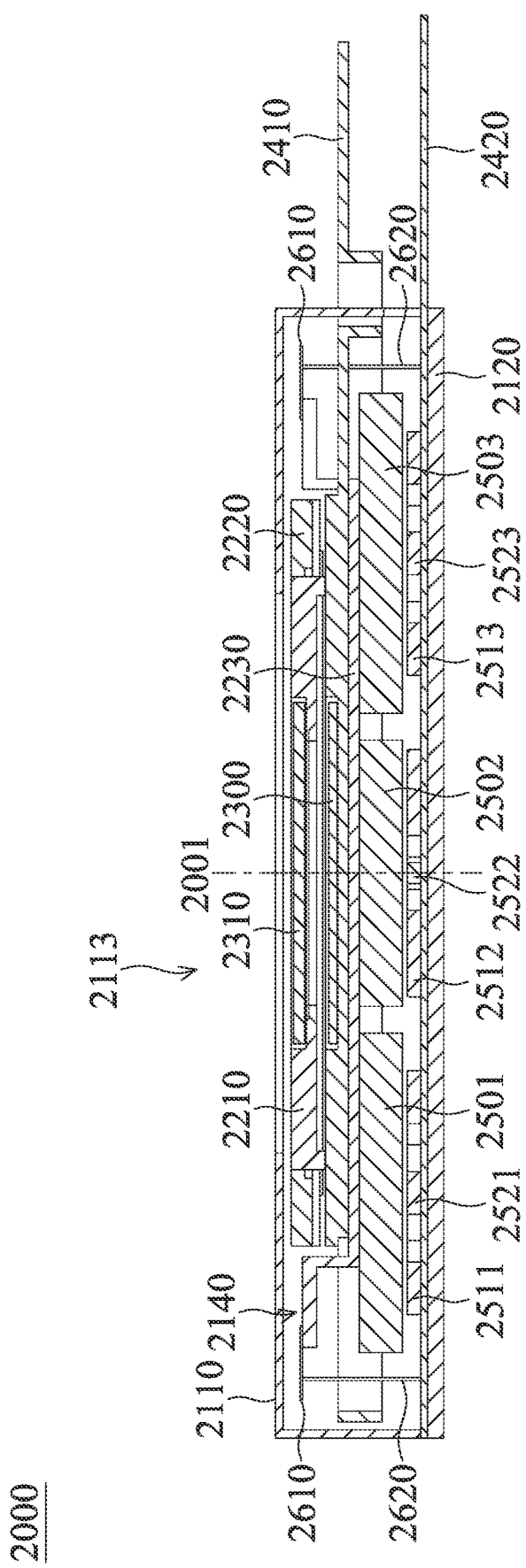
FIG. 2D is a cross-sectional view illustrated along a second axis in FIG. 2C.

FIG. 2A is a schematic view of an optical element driving mechanism 2000. FIG. 2B is an exploded view of the optical element driving mechanism 2000. FIG. 2C is a top view of the optical element driving mechanism 2000. FIG. 2D is a cross-sectional view illustrated along a second axis 2002 in FIG. 2C. The optical axis 2001, the second axis 2002, and the third axis 2003 may be perpendicular to each other and may pass through the center of the optical element driving mechanism 2000.

The optical element driving mechanism 2000 may be used for substitute the optical element driving mechanism 1100 to be disposed in the optical system 1000, and the optical element driving mechanism 2000 may include a first case 2110, a first bottom 2120, a first holder 2210, a second holder 2220, a third holder 2230, a first optical element 2300, a light filtering element 2310, a first circuit assembly 2410, a second circuit assembly 2420, a first magnetic element 2501, a second magnetic element 2502, a third magnetic element 2503, a first coil 2511, a second coil 2512, a third coil 2513, a first sensing element 2521, a second sensing element 2522, a third sensing element 2523, a first connecting element 2610, and a second connecting element 2620 arrange along the optical axis 2001.

In some embodiments, the first case 2110 and the first bottom 2120 may be called as a fixed portion 2100, the first holder 2210, the second holder 2220, and the third holder 2230 may be called as a movable portion 2200. The first magnetic element 2501, the second magnetic element 2502, the third magnetic element 2503, the first coil 2511, the second coil 2512, and the third coil 2513 may be called as a driving assembly 2500. The first connecting element 2610 and the second connecting element 2620 may be called as a connecting assembly 2600.

A first opening 2113 may be formed on the first case 2110. The light filtering element 2310 may be a light filter, may be exposed from the first opening 2113 and used for filtering light with specific wavelength (e.g. infrared or UV light) to only allow light with specific wavelength to pass through, and then reach the first optical element 2300. The light filtering element 2310 may be disposed on the first holder 2210, and the first holder 2210 may be disposed on the second holder 2220. The second holder 2220 and the first optical element 2300 may be disposed on the first circuit assembly 2410. The first circuit assembly 2410 may be disposed on the third holder 2230. The third holder 2230 may be movably connected to the first bottom 2120 through the connecting assembly 2600. In other words, the movable portion 2200 may be used for holding the first optical element 2300, and may be movably connected to the fixed portion 2100 through the connecting assembly 2600. The first optical element 2300 may include an image sensor. The first connecting element 2610 of the connecting assembly 2600 may include springs, and the second connecting element 2620 of the connecting assembly 2600 may include suspension wires to movably connect the fixed portion 2100 and the movable portion 2200. In some embodiments, the optical element driving mechanism 2000 may include four first connecting element 2610 and four second connecting element 2620 disposed on four corners of the optical element driving mechanism 2000 to maintain the position of the movable portion 2200 relative to the fixed portion 2100.

The first magnetic element 2501, the second magnetic element 2502, and the third magnetic element 2503 of the driving assembly 2500 may be disposed on the third holder 2230, and the first coil 2511, the second coil 2512, and the third coil 2513 may be disposed on the second circuit assembly 2420. The second circuit assembly 2420 may be disposed on the first bottom 2120, the first magnetic element 2501, the second magnetic element 2502, and the third magnetic element 2503 may be magnets, and when current passes through the first coil 2511, the second coil 2512, and the third coil 2513. Afterwards, the first magnetic element 2501, the second magnetic element 2502, and the third magnetic element 2503 may interact with the first coil 2511, the second coil 2512, and the third coil 2513 to generate electromagnetic driving force to move the movable portion 2200 relative to the fixed portion 2100. In some embodiments, the positions of the first magnetic element 2501, the second magnetic element 2502, and the third magnetic element 2503 may be exchanged with the first coil 2511, the second coil 2512, and the third coil 2513. For example, the first magnetic element 2501, the second magnetic element 2502, and the third magnetic element 2503 may be disposed on the fixed portion 2100, and the first coil 2511, the second coil 2512, and the third coil 2513 may be disposed on the movable portion 2200, depending on the design requirement.

Figure 2E:
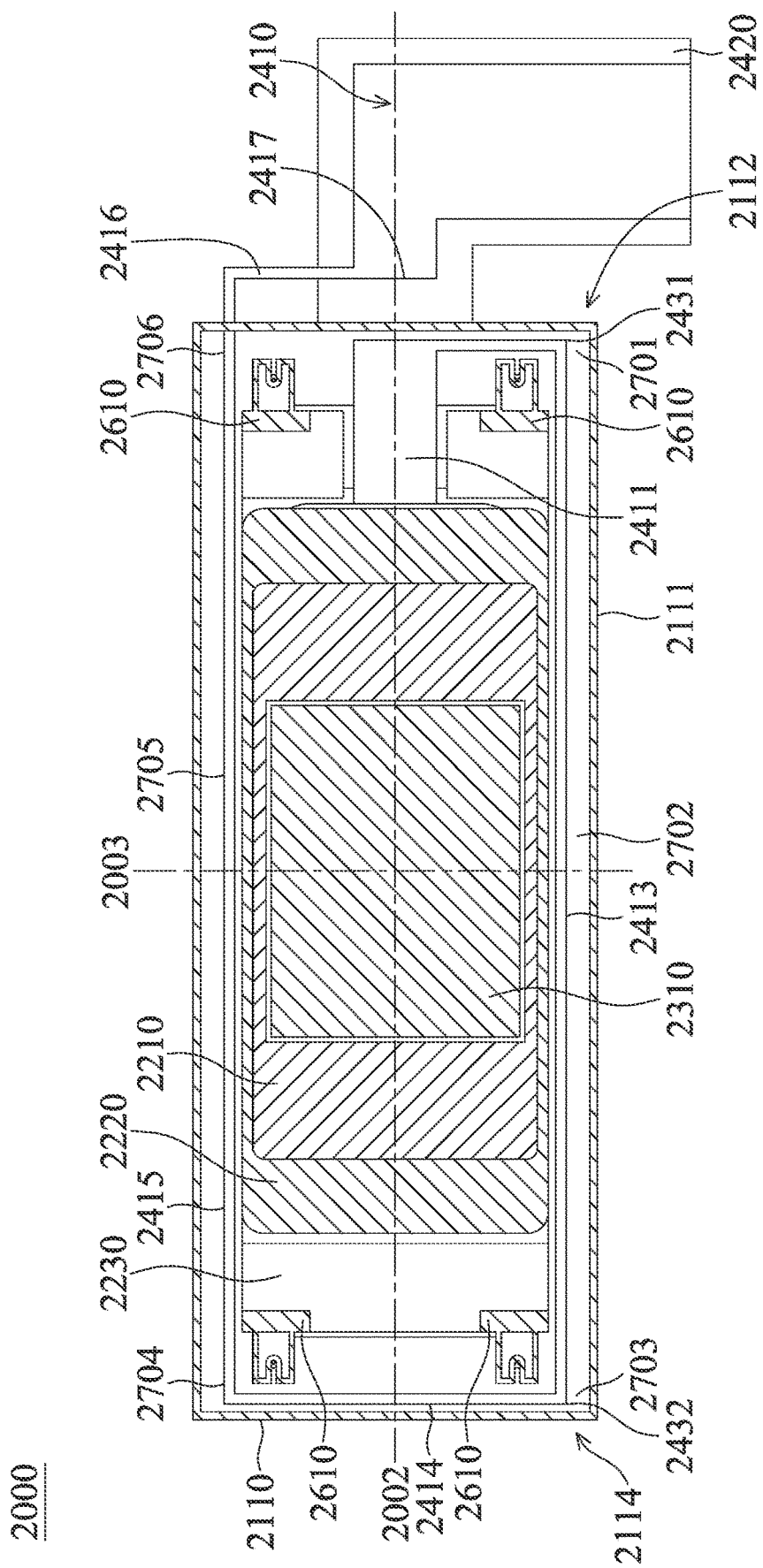
FIG. 2E is a top view of some elements of the optical element driving mechanism.

FIG. 2E is a top view of some elements of the optical element driving mechanism 2000. The first circuit assembly 2410 may use for providing energy required for the operation of the first optical element 2300, and may allow the first optical element 2300 movably connect to the fixed portion 2100 through the first circuit assembly 2410. The second circuit assembly 2420 may provide energy that the first coil 2511, the second coil 2512, and the third coil 2513 require when operating. For example, as shown in FIG. 2E, the first circuit assembly 2410 surrounds the movable portion 2200 and includes a first segment 2411, a second segment 2412, a third segment 2413, a fourth segment 2414, a fifth segment 2415, a sixth segment 2416, and a seventh segment 2417 connecting with each other in sequence when viewed along the optical axis 2001.

The first segment 2411, the third segment 2413, the fifth segment 2415, and the seventh segment 2417 may extend along the second axis 2002, and the second segment 2412, the fourth segment 2414, and the sixth segment 2416 may extend along the third axis 2003. The optical axis 2001, the second axis 2002, and the third axis 2003 may be perpendicular to each other. In other words, the first segment 2411 and the second segment 2412 are not parallel. The first segment 2411, the second segment 2412, the third segment 2413, the fourth segment 2414, the fifth segment 2415, the sixth segment 2416, and the seventh segment 2417 are plate-shaped. In some embodiments, when the optical element driving mechanism 2000 substitutes the optical element driving mechanism 1100 and is disposed in the optical system 1000, the third axis 2003 and the first axis 1002 may be parallel.

In some embodiments, the second segment 2412, the third segment 2413, the fourth segment 2414, the fifth segment 2415, and the sixth segment 2416 do not in direct contact with the fixed portion 2100 and the movable portion 2200. In other words, gaps are between the second segment 2412, the third segment 2413, the fourth segment 2414, the fifth segment 2415, the sixth segment 2416 and the fixed portion 2100 and the movable portion 2200 to increase the durability of the first circuit assembly 2410. When viewed along the optical axis 2001, the optical element driving mechanism 2000 is strip-shaped and extends along the second axis 2002.

In some embodiments, the third segment 2413 is plate-shaped, and the direction of the normal vector of the third segment 2413 is different from the direction of the normal vector of the first segment 2411 that is also plate-shaped. For example, the normal vector of the third segment 2413 may be parallel to the third axis 2003, and the normal vector of the first segment 2411 may be parallel to the optical axis 2001. In other words, the first segment 2411 and the third segment 2413 are not parallel. In some embodiments, the third segment 2413 and the fourth segment 2414 extend in different directions, that is, the third segment 2413 and the fourth segment 2414 are not parallel. In some embodiments, the fifth segment 2415 is not parallel to the fourth segment 2414, the sixth segment 2416 is not parallel to the fifth segment 2415, and the seventh segment 2417 is not parallel to the sixth segment 2416.

In some embodiments, the optical element driving mechanism 2000 may further include a first damping element 2701, a second damping element 2702, a third damping element 2703, a fourth damping element 2704, a fifth damping element 2705, and a sixth damping element 2706. The first damping element 2701, the second damping element 2702, the third damping element 2703, the fourth damping element 2704, the fifth damping element 2705, and the sixth damping element 2706 may include resin, and may be used for absorbing the abnormal vibration of the movable portion 2200 relative to the fixed portion 2100. The first damping element 2701 may in direct contact with a first bending portion 2431 of the first circuit assembly 2410 and the fixed portion 2100. When viewed along the optical axis 2001, the optical element driving mechanism 2000 is polygonal, and the first magnetic element 2501 is position at a first corner 2112 of the optical element driving mechanism 2000.

In some embodiments, the second damping element 2702 is at a first edge 2111 of the optical element driving mechanism 2000 and in direct contact with the third segment 2413 of the first circuit assembly 2410 and the movable portion 2200. In some embodiments, when viewed along the optical axis 2001, the third damping element 2703 is at a second corner 2114 of the optical element driving mechanism 2000 and in direct contact with a second bending portion 2432 of the first circuit assembly 2410 and the connecting assembly 2600 (e.g. the first connecting element 2610). The fourth damping element 2704, the fifth damping element 2705, the sixth damping element 2706 may position on opposite positions of the third damping element 2703, the second damping element 2702 and the first damping element 2701, respectively, such as disposed on opposite sides of the second axis 2002, and it is not repeated.

Figure 2F:
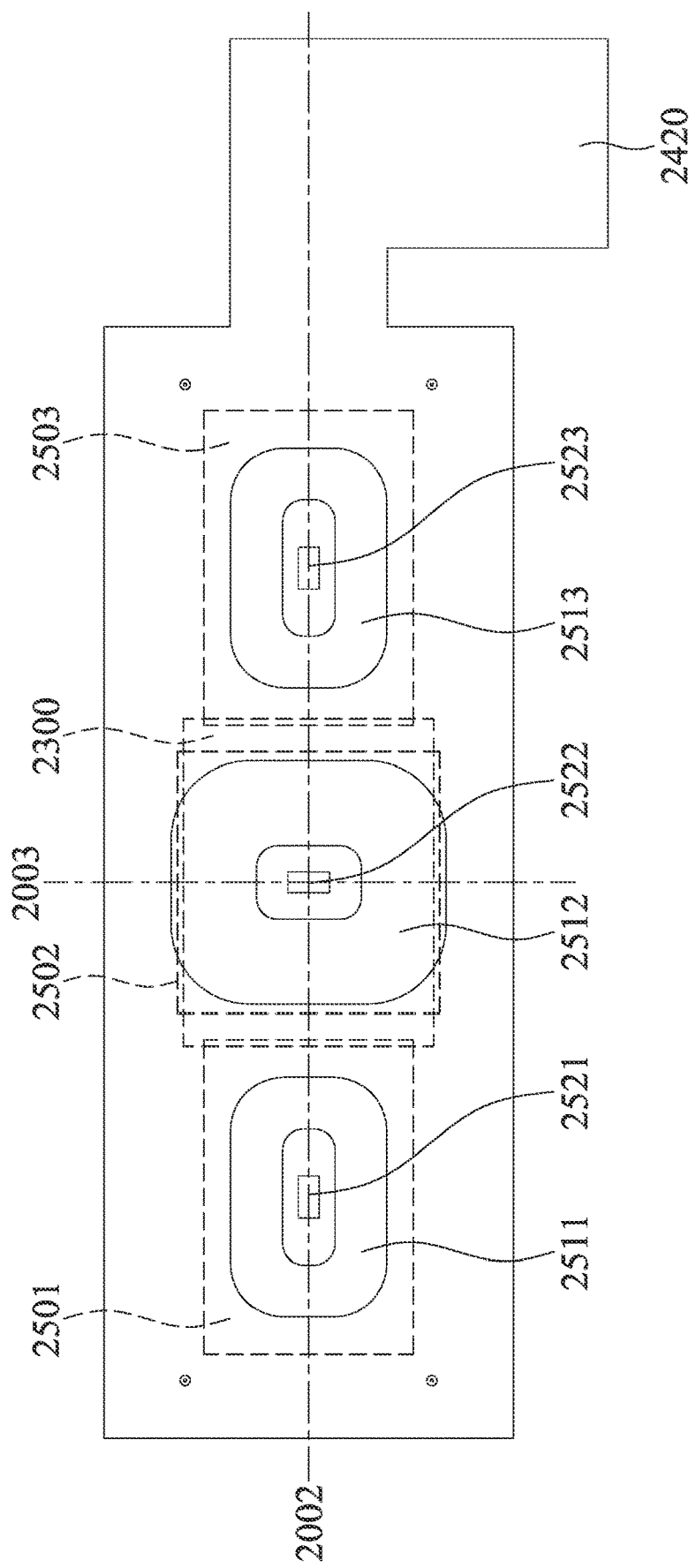
FIG. 2F is a top view of some elements of the optical element driving mechanism.

FIG. 2F is a top view of some elements of the optical element driving mechanism 2000. As shown in FIG. 2F, the first coil 2511, the second coil 2512, and the third coil 2513 are strip-shaped when viewed along the optical axis 2001 (which is parallel to the coil axes of the first coil 2511, the second coil 2512, and the third coil 2513). The first coil 2511 and the third coil 2513 extend along the second axis 2002, and the second coil 2512 extends along the third axis 2003. The first coil 2511, the second coil 2512, and the third coil 2513 arrange along the second axis 2002.

The first magnetic element 2501, the second magnetic element 2502, and the third magnetic element 2503 respectively correspond to the first coil 2511, the second coil 2512, and the third coil 2513. Therefore, the first magnetic element 2501, the second magnetic element 2502, and the third magnetic element 2503 are arrange along the second axis 2002, and at least partially overlap each other in the direction that the optical axis 2001 extends. Moreover, the centers of the first magnetic element 2501 and the third magnetic element 2503 do not overlap the center of the first optical element 2300, and the center of the second magnetic element 2502 and the center of the first optical element 2300 at least partially overlap each other. In other words, when viewed along the optical axis 2001, the distance between the center of the first magnetic element 2501 and the center of the first optical element 2300 is greater than the distance between the center of the second magnetic element 2502 and the center of the first optical element 2300. It should be noted that the feature is not limited in this embodiment, and such feature is also applicable in other embodiments, depending on design requirements. In some embodiments, the first coil 2511, the second coil 2512, and the third coil 2513 at least partially overlap each other in the direction that the second axis 2002 extends.

A first driving force may be generated between the first magnetic element 2501 and the first coil 2511, a second driving force may be generated between the second magnetic element 2502 and the second coil 2512, and a third driving force may be generated between the third magnetic element 2503 and the third coil 2513. It should be noted that the directions of the first driving force and the third driving force may be parallel to the third axis 2003, and the direction of the second driving force may be parallel to the second axis 2002. In other words, the directions of the first driving force and the third driving force may be parallel, such as may orient toward and identical direction or opposite directions. The directions of the first driving force or the third driving force may be perpendicular to the direction of the second driving force.

The first sensing element 2521, the second sensing element 2522, and the third sensing element 2523 may be used for detecting the movement of the movable portion 2200 relative to the fixed portion 2100, such as a linear movement of the movable portion 2200 relative to the fixed portion 2100. The first sensing element 2521, the second sensing element 2522, and the third sensing element 2523 may include a Hall sensor, a magnetoresistance effect sensor (MR sensor), a giant magnetoresistance effect sensor (GMR sensor), a tunneling magnetoresistance effect sensor (TMR sensor), or a fluxgate sensor.

In some embodiments, the first coil 2511, the second coil 2512, and the third coil 2513 respectively surround the first sensing element 2521, the second sensing element 2522, and the third sensing element 2523. Moreover, because the first sensing element 2521 and the third sensing element 2523 are arrange along the second axis 2002, the first sensing element 2521 and the third sensing element 2523 may also be used for detecting the rotation of the movable portion 2200 relative to the fixed portion 2100.

As shown in FIG. 2D, the first optical element 2300 is between the first opening 2113 and the third coil 2513 in the direction that the optical axis 2001 extends. In other words, the first optical element 2300 is between the driving assembly 2500 and the first opening 2113 in the direction that the optical axis 2001 extends to allow the light pass through the first opening 2113 and reach the first optical element 2300. Because the driving assembly 2500 is at the side of the first optical element 2300 facing away from the first opening 2113, the focus distance of the optical system 1000 having the optical element driving mechanism 2000 may be reduced, and the size of the optical element driving mechanism 2000 in specific directions may be reduced to achieve miniaturization.

Figure 3A:
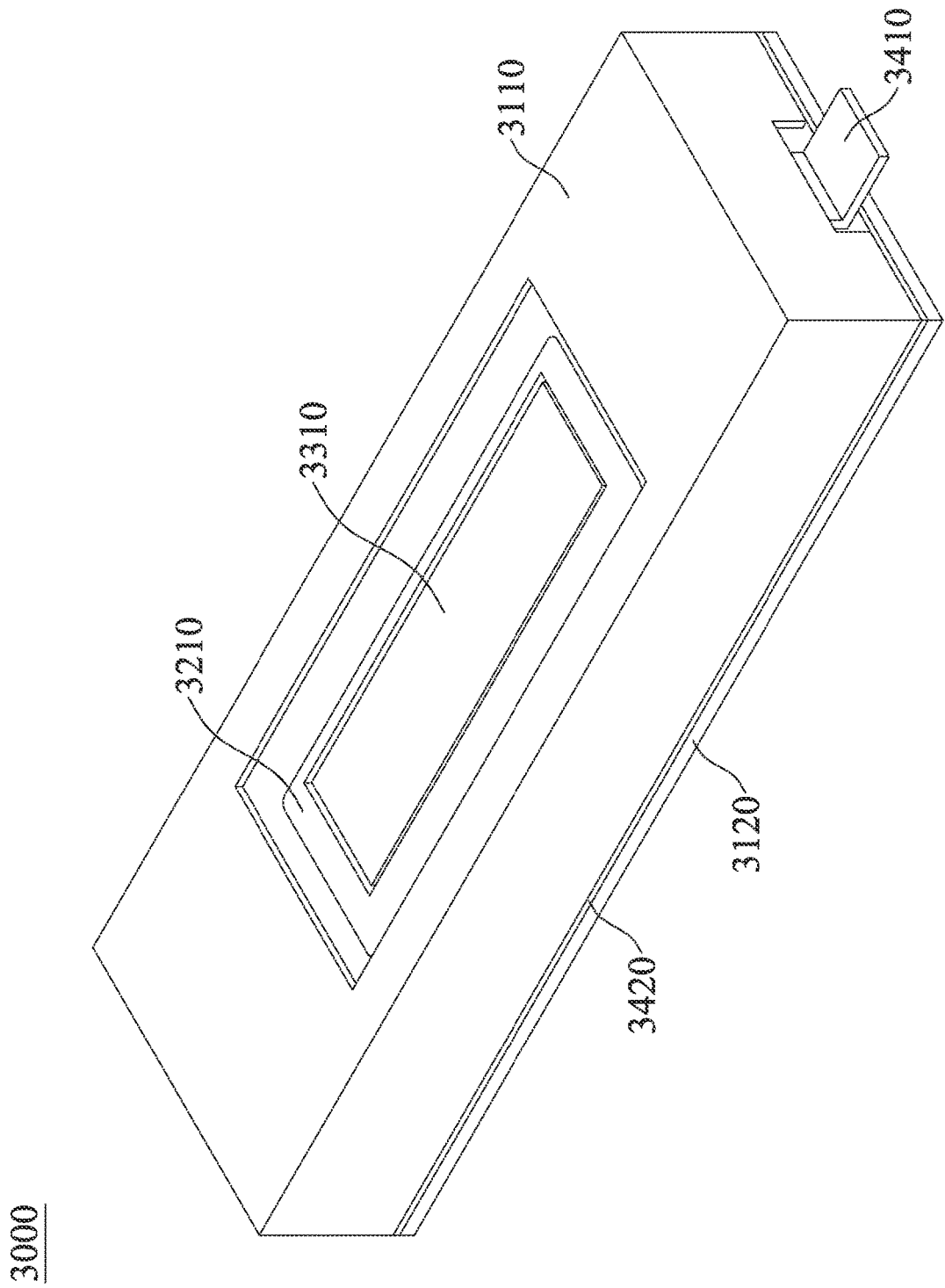
FIG. 3A is a schematic view of an optical element driving mechanism.
Figure 3B:
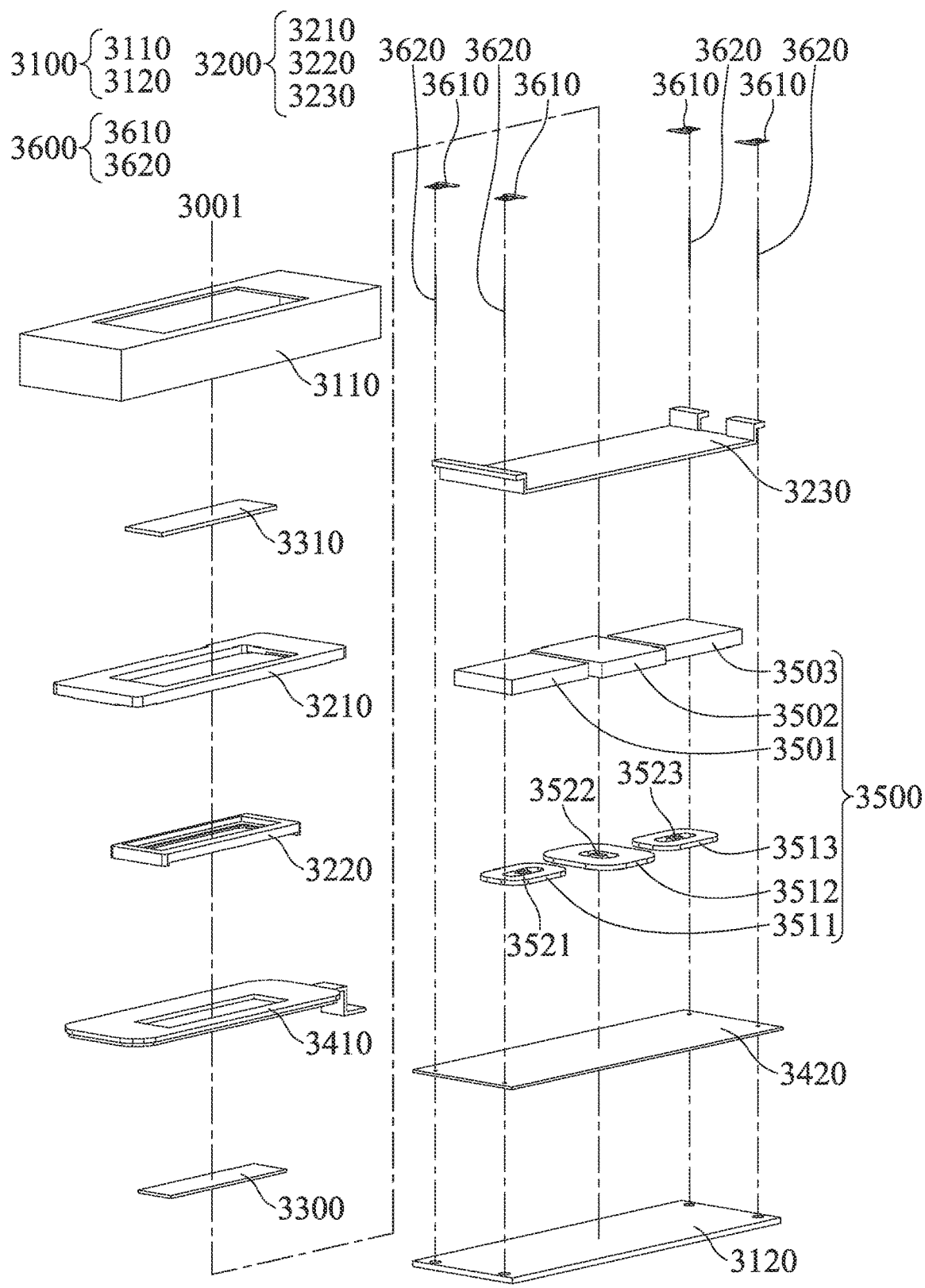
FIG. 3B is an exploded view of the optical element driving mechanism.
Figure 3C:
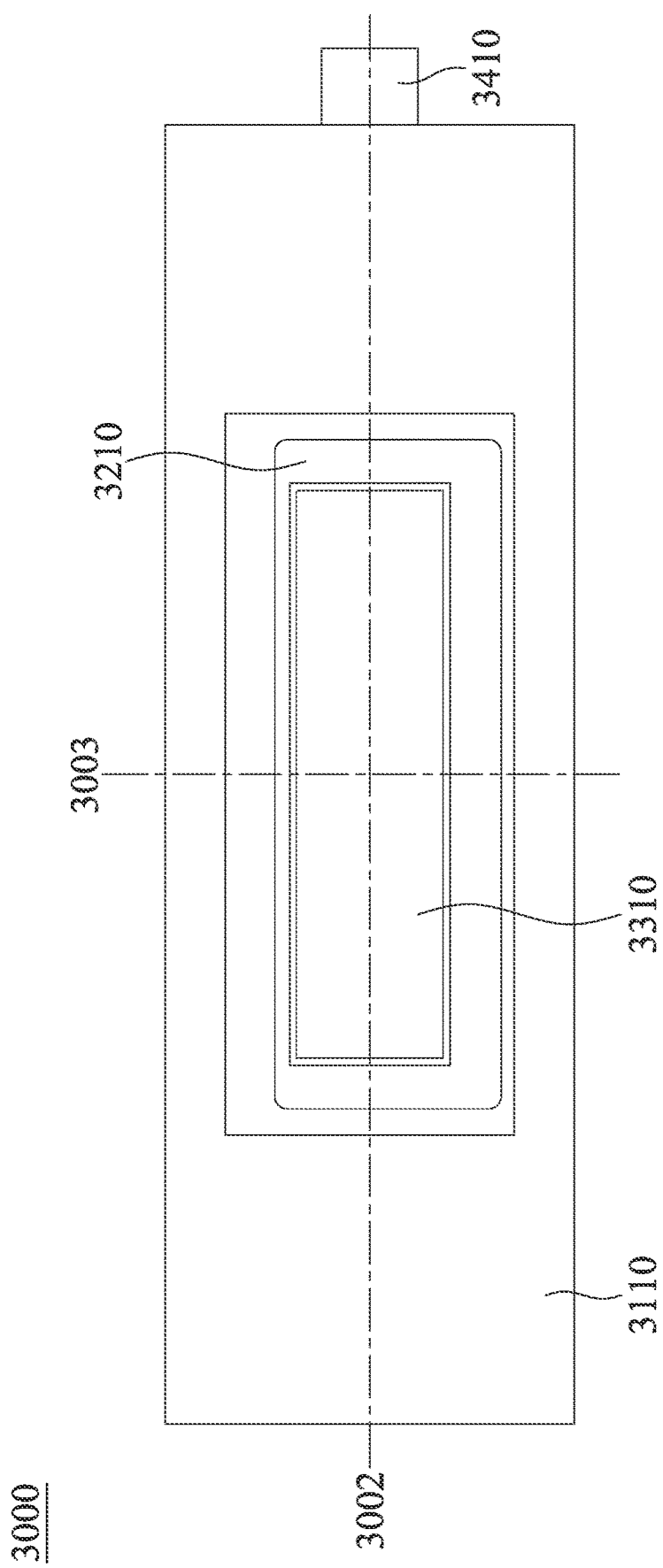
FIG. 3C is a top view of the optical element driving mechanism.
Figure 3D:
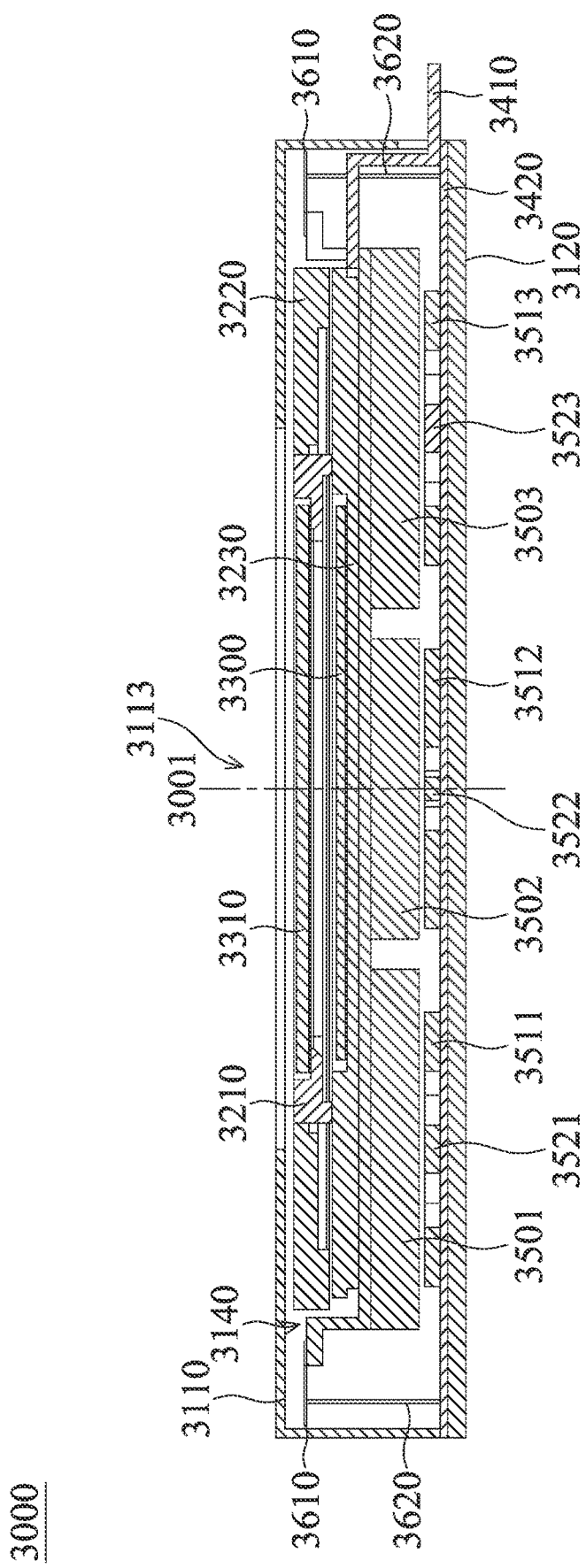
FIG. 3D is a cross-sectional view illustrated along a second axis in FIG. 3C.

FIG. 3A is a schematic view of an optical element driving mechanism 3000. FIG. 3B is an exploded view of the optical element driving mechanism 3000. FIG. 3C is a top view of the optical element driving mechanism 3000. FIG. 3D is a cross-sectional view illustrated along a second axis 3002 in FIG. 3C. The optical axis 3001, the second axis 3002, and the third axis 3003 may be perpendicular to each other and may pass through the center of the optical element driving mechanism 3000.

The optical element driving mechanism 3000 may be used for substitute the optical element driving mechanism 1100 to be disposed in the optical system 1000, and the optical element driving mechanism 3000 may include a first case 3110, a first bottom 3120, a first holder 3210, a second holder 3220, a third holder 3230, a first optical element 3300, a light filtering element 3310, a first circuit assembly 3410, a second circuit assembly 3420, a first magnetic element 3501, a second magnetic element 3502, a third magnetic element 3503, a first coil 3511, a second coil 3512, a third coil 3513, a first sensing element 3521, a second sensing element 3522, a third sensing element 3523, a first connecting element 3610, and a second connecting element 3620 arrange along the optical axis 3001.

In some embodiments, the first case 3110 and the first bottom 3120 may be called as a fixed portion 3100, the first holder 3210, the second holder 3220, and the third holder 3230 may be called as a movable portion 3200. The first magnetic element 3501, the second magnetic element 3502, the third magnetic element 3503, the first coil 3511, the second coil 3512, and the third coil 3513 may be called as a driving assembly 3500. The first connecting element 3610 and the second connecting element 3620 may be called as a connecting assembly 3600.

A first opening 3113 may be formed on the first case 3110. The light filtering element 3310 may be a light filter, may be exposed from the first opening 3113 and used for filtering light with specific wavelength (e.g. infrared or UV light) to only allow light with specific wavelength to pass through, and then reach the first optical element 3300. The light filtering element 3310 may be disposed on the first holder 3210, and the first holder 3210 may be disposed on the second holder 3220. The second holder 3220 and the first optical element 3300 may be disposed on the first circuit assembly 3410. The first circuit assembly 3410 may be disposed on the third holder 3230. The third holder 3230 may be movably connected to the first bottom 3120 through the connecting assembly 3600. In other words, the movable portion 3200 may be used for holding the first optical element 3300, and may be movably connected to the fixed portion 3100 through the connecting assembly 3600. The first optical element 3300 may include an image sensor. The first connecting element 3610 of the connecting assembly 3600 may include springs, and the second connecting element 3620 of the connecting assembly 3600 may include suspension wires to movably connect the fixed portion 3100 and the movable portion 3200. In some embodiments, the optical element driving mechanism 3000 may include four first connecting element 3610 and four second connecting element 3620 disposed on four corners of the optical element driving mechanism 3000 to maintain the position of the movable portion 3200 relative to the fixed portion 3100.

The first magnetic element 3501, the second magnetic element 3502, and the third magnetic element 3503 of the driving assembly 3500 may be disposed on the third holder 3230, and the first coil 3511, the second coil 3512, and the third coil 3513 may be disposed on the second circuit assembly 3420. The second circuit assembly 3420 may be disposed on the first bottom 3120, the first magnetic element 3501, the second magnetic element 3502, and the third magnetic element 3503 may be magnets, and when current passes through the first coil 3511, the second coil 3512, and the third coil 3513. Afterwards, the first magnetic element 3501, the second magnetic element 3502, and the third magnetic element 3503 may interact with the first coil 3511, the second coil 3512, and the third coil 3513 to generate electromagnetic driving force to move the movable portion 3200 relative to the fixed portion 3100. In some embodiments, the positions of the first magnetic element 3501, the second magnetic element 3502, and the third magnetic element 3503 may be exchanged with the first coil 3511, the second coil 3512, and the third coil 3513. For example, the first magnetic element 3501, the second magnetic element 3502, and the third magnetic element 3503 may be disposed on the fixed portion 3100, and the first coil 3511, the second coil 3512, and the third coil 3513 may be disposed on the movable portion 3200, depending on the design requirement.

It should be noted that the configuration of the first magnetic element 3501, the second magnetic element 3502, the third magnetic element 3503, the first coil 3511, the second coil 3512, the third coil 3513, the first sensing element 3521, the second sensing element 3522, and the third sensing element 3523 may be identical or similar to the configuration of the first magnetic element 2501, the second magnetic element 2502, the third magnetic element 2503, the first coil 2511, the second coil 2512, the third coil 2513, the first sensing element 2521, the second sensing element 2522, and the third sensing element 2523, and is not repeated.

Figure 3E:
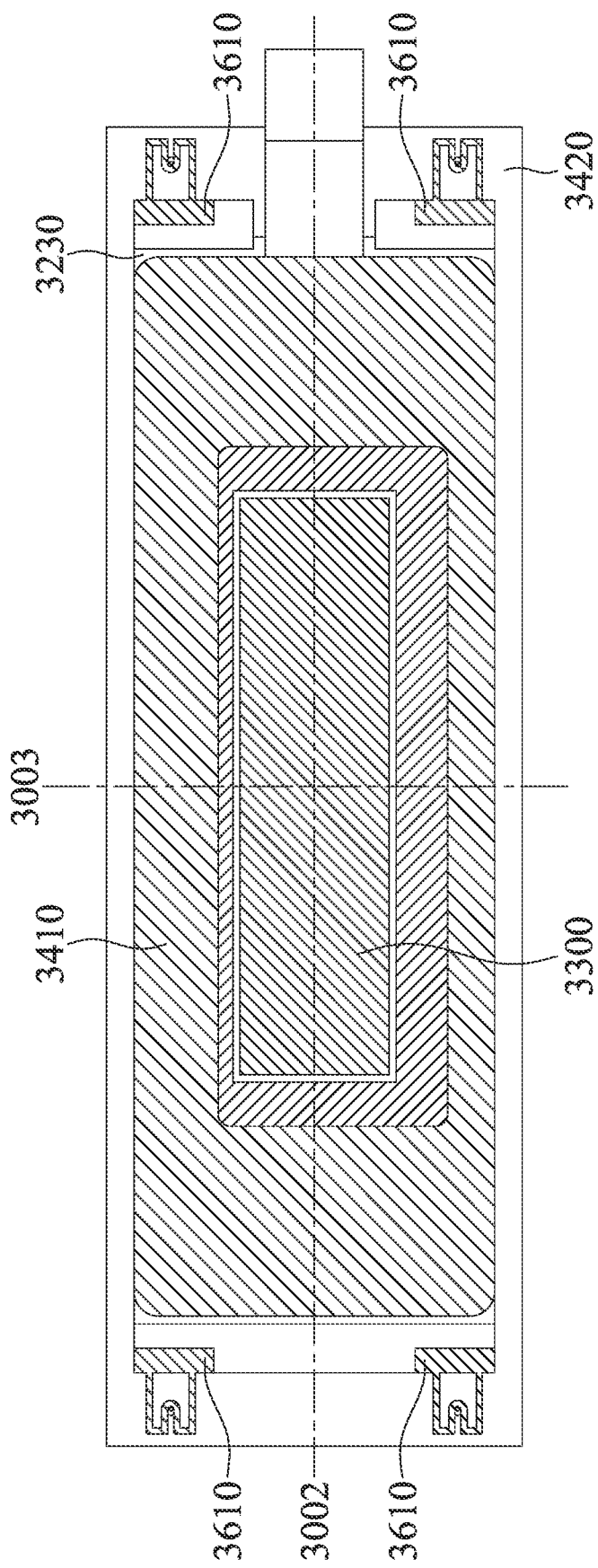
FIG. 3E is a schematic view of some elements of the optical element driving mechanism

The first circuit assembly 2410 may include multiple segments that surround the movable portion 2200, but the present disclosure is not limited thereto. For example, FIG. 3E is a schematic view of some elements of the optical element driving mechanism 3000, which mainly shows the first circuit assembly 3410 and other elements. The first circuit assembly 3410 may be disposed on the third holder 3230 of the movable portion 3200, and the external segment of the first circuit assembly 3410 does not surround the movable portion 3200. Therefore, the length of the required circuit may be reduced to achieve miniaturization.

Figure 4A:
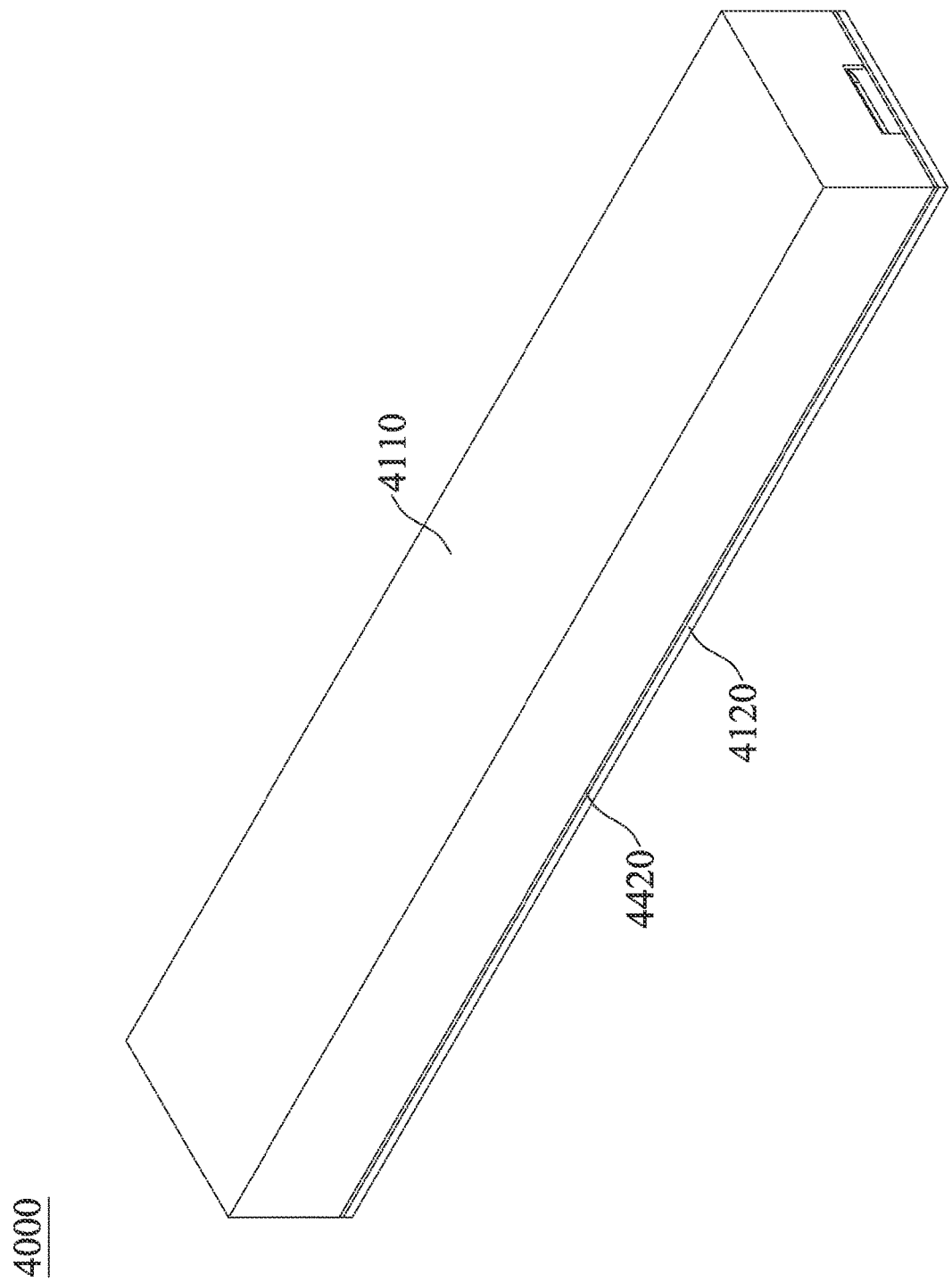
FIG. 4A is a schematic view of an optical element driving mechanism.
Figure 4B:
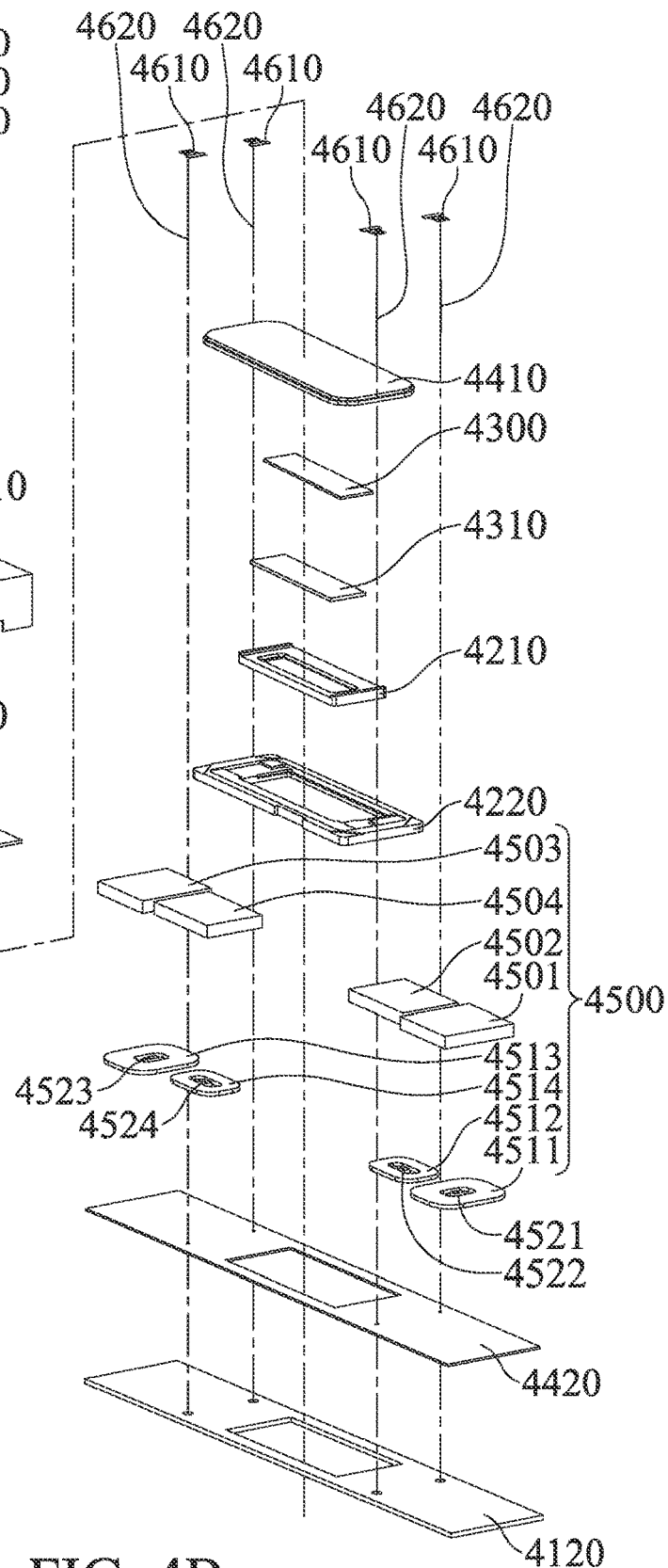
FIG. 4B is an exploded view of the optical element driving mechanism.
Figure 4C:
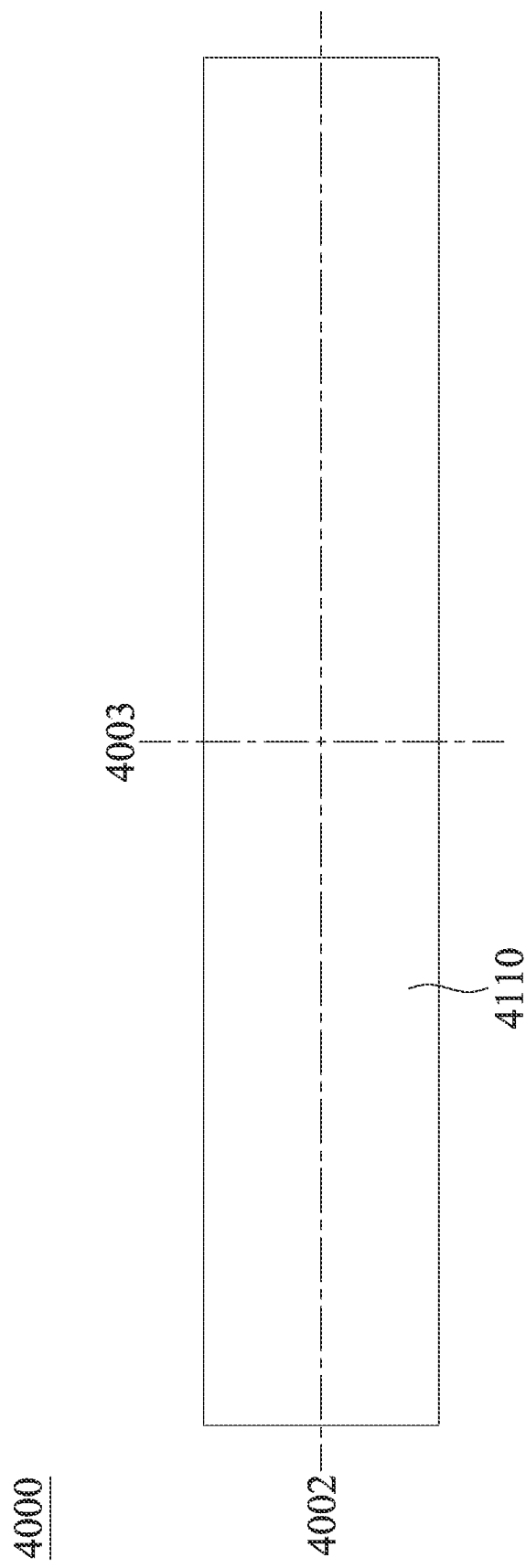
FIG. 4C is a top view of the optical element driving mechanism.
Figure 4D:
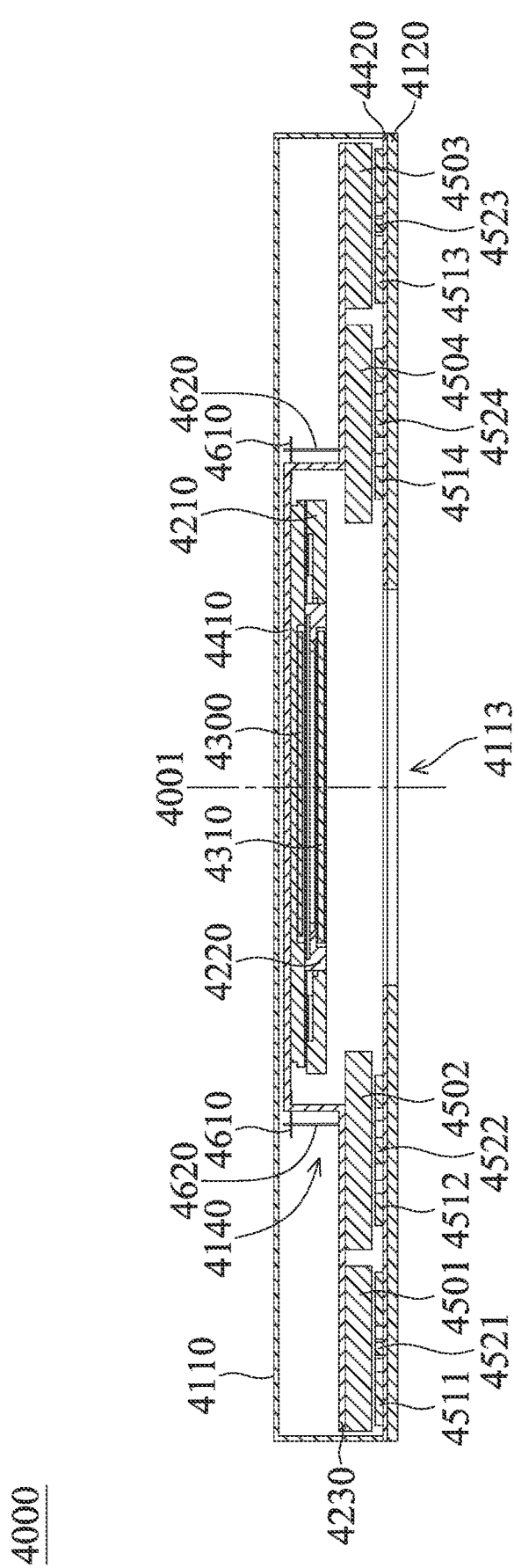
FIG. 4D is a cross-sectional view illustrated along a second axis in FIG. 4C.

FIG. 4A is a schematic view of an optical element driving mechanism 4000. FIG. 4B is an exploded view of the optical element driving mechanism 4000. FIG. 4C is a top view of the optical element driving mechanism 4000. FIG. 4D is a cross-sectional view illustrated along a second axis 4002 in FIG. 4C. The optical axis 4001, the second axis 4002, and the third axis 4003 may be perpendicular to each other and may pass through the center of the optical element driving mechanism 4000.

The optical element driving mechanism 4000 may be used for substitute the optical element driving mechanism 1100 to be disposed in the optical system 1000, and the optical element driving mechanism 4000 may include a first case 4110, a first bottom 4120, a first holder 4210, a second holder 4220, a third holder 4230, a first optical element 4300, a light filtering element 4310, a first circuit assembly 4410, a second circuit assembly 4420, a first magnetic element 4501, a second magnetic element 4502, a third magnetic element 4503, a first coil 4511, a second coil 4512, a third coil 4513, a first sensing element 4521, a second sensing element 4522, a third sensing element 4523, a first connecting element 4610, and a second connecting element 4620 arrange along the optical axis 4001.

In some embodiments, the first case 4110 and the first bottom 4120 may be called as a fixed portion 4100, the first holder 4210, the second holder 4220, and the third holder 4230 may be called as a movable portion 4200. The first magnetic element 4501, the second magnetic element 4502, the third magnetic element 4503, the fourth magnetic element 4504, the first coil 4511, the second coil 4512, the third coil 4513, and the fourth coil 4514 may be called as a driving assembly 4500. The first connecting element 4610 and the second connecting element 4620 may be called as a connecting assembly 4600.

A first opening 4113 may be formed on the first case 4110. The light filtering element 4310 may be a light filter, may be exposed from the first opening 4113 and used for filtering light with specific wavelength (e.g. infrared or UV light) to only allow light with specific wavelength to pass through, and then reach the first optical element 4300. The light filtering element 4310 may be disposed on the first holder 4210, and the first holder 4210 may be disposed on the second holder 4220. The second holder 4220 and the first optical element 4300 may be disposed on the first circuit assembly 4410. The first circuit assembly 4410 may be disposed on the third holder 4230. The third holder 4230 may be movably connected to the first bottom 4120 through the connecting assembly 4600. In other words, the movable portion 4200 may be used for holding the first optical element 4300, and may be movably connected to the fixed portion 4100 through the connecting assembly 4600. The first optical element 4300 may include an image sensor. The first connecting element 4610 of the connecting assembly 4600 may include springs, and the second connecting element 4620 of the connecting assembly 4600 may include suspension wires to movably connect the fixed portion 4100 and the movable portion 4200. In some embodiments, the optical element driving mechanism 4000 may include four first connecting element 4610 and four second connecting element 4620 disposed on four corners of the optical element driving mechanism 4000 to maintain the position of the movable portion 4200 relative to the fixed portion 4100.

The first magnetic element 4501, the second magnetic element 4502, the third magnetic element 4503, and the fourth magnetic element 4504 of the driving assembly 4500 may be disposed on the third holder 4230, and the first coil 4511, the second coil 4512, the third coil 4513, and the fourth coil 4514 may be disposed on the second circuit assembly 4420. The second circuit assembly 4420 may be disposed on the first bottom 4120, the first magnetic element 4501, the second magnetic element 4502, the third magnetic element 4503, and the fourth magnetic element 4504 may be magnets, and when current passes through the first coil 4511, the second coil 4512, the third coil 4513, and the fourth coil 4514. Afterwards, the first magnetic element 4501, the second magnetic element 4502, the third magnetic element 4503, and the fourth magnetic element 4504 may interact with the first coil 4511, the second coil 4512, the third coil 4513, and the fourth coil 4514 to generate electromagnetic driving force to move the movable portion 4200 relative to the fixed portion 4100. In some embodiments, the positions of the first magnetic element 4501, the second magnetic element 4502, the third magnetic element 4503, and the fourth magnetic element 4504 may be exchanged with the first coil 4511, the second coil 4512, the third coil 4513, and the fourth coil 4514. For example, the first magnetic element 4501, the second magnetic element 4502, the third magnetic element 4503, and the fourth magnetic element 4504 may be disposed on the fixed portion 4100, and the first coil 4511, the second coil 4512, the third coil 4513, and the fourth coil 4514 may be disposed on the movable portion 4200, depending on the design requirement.

Figure 4E:
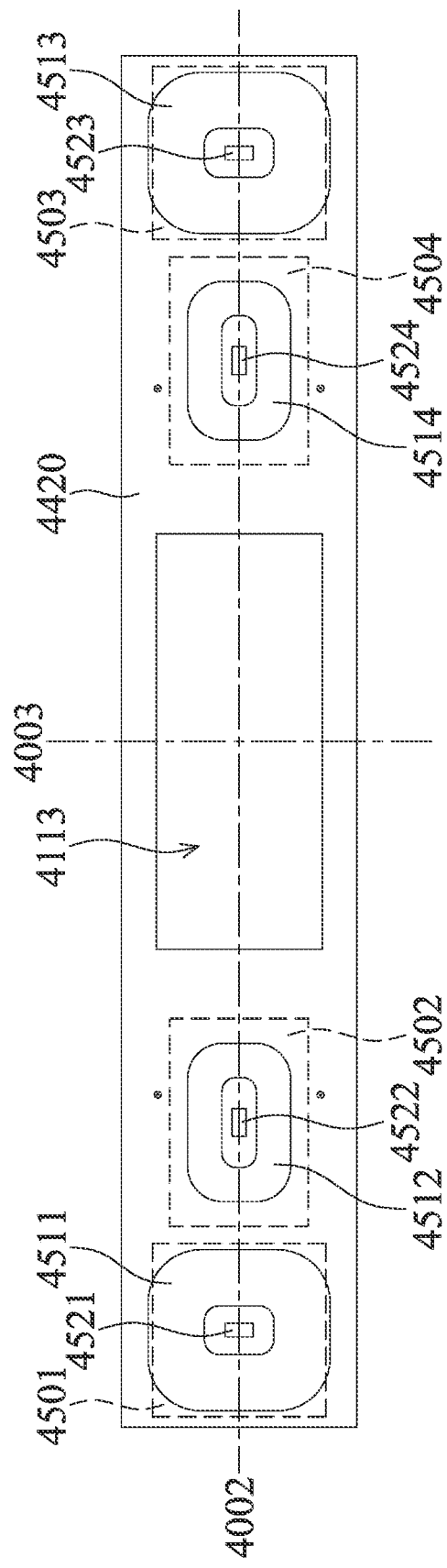
FIG. 4E is a top view of some elements of the optical element driving mechanism.

FIG. 4E is a top view of some elements of the optical element driving mechanism 4000. As shown in FIG. 4E, the first coil 4511, the second coil 4512, the third coil 4513, and the fourth coil 4514 are strip-shaped when viewed along the optical axis 4001 (which is parallel to the coil axes of the first coil 4511, the second coil 4512, the third coil 4513, and the fourth coil 4514). The first coil 4511 and the third coil 4513 extend along the second axis 4002, and the second coil 4512 and the fourth coil 4514 extend the third axis 4003. The first coil 4511, the second coil 4512, the fourth coil 4514, and the third coil 4513 arrange along the second axis 4002.

The first magnetic element 4501, the second magnetic element 4502, the third magnetic element 4503, and the fourth magnetic element 4504 respectively correspond to the first coil 4511, the second coil 4512, the third coil 4513, and the fourth coil 4514. Therefore, the first magnetic element 4501, the second magnetic element 4502, the fourth magnetic element 4504, and the third magnetic element 4503 are arrange along the second axis 4002, and at least partially overlap each other in the direction that the optical axis 4001 extends. Moreover, when viewed along the second axis 4002, the distance between the center of the first magnetic element 4501 and the center of the first optical element 4300 is greater than the distance between the center of the second magnetic element 4502 and the center of the first optical element 4300. It should be noted that the feature is not limited in this embodiment, and such feature is also applicable in other embodiments, depending on design requirements. In some embodiments, the first coil 4511, the second coil 4512, the third coil 4513, and the fourth coil 4514 at least partially overlap each other in the direction that the second axis 4002 extends.

A first driving force may be generated between the first magnetic element 4501 and the first coil 4511, a second driving force may be generated between the second magnetic element 4502 and the second coil 4512, a third driving force may be generated between the third magnetic element 4503 and the third coil 4513, and a fourth driving force may be generated between the fourth magnetic element 4504 and the fourth coil 4514. It should be noted that the directions of the first driving force and the third driving force may be parallel to the second axis 4002, and the direction of the second driving force and the fourth driving force may be parallel to the third axis 4003. In other words, the directions of the first driving force and the third driving force may be parallel, such as may orient toward and identical direction or opposite directions. The directions of the first driving force or the third driving force may be perpendicular to the direction of the second driving force and the fourth driving force. Moreover, when viewed along the optical axis 4001, the center of the first optical element 4300 is between the first magnetic element 4501 and the third magnetic element 4503, and is also between the second magnetic element 4502 and the fourth magnetic element 4504.

It should be noted that the driving assembly 4500 is positioned at a side of the first optical element 4300 facing the first opening 4113 in such embodiments, so the focus distance of the optical system 1000 having the optical element driving mechanism 4000 may be increased, and the size of the optical element driving mechanism 4000 in specific directions may be decreased to achieve miniaturization.

The first sensing element 4521, the second sensing element 4522, the third sensing element 4523, and the fourth sensing element 4524 may be used for detecting the movement of the movable portion 4200 relative to the fixed portion 4100, such as a linear movement of the movable portion 4200 relative to the fixed portion 4100. The first sensing element 4521, the second sensing element 4522, the third sensing element 4523, and the fourth sensing element 4524 may include a Hall sensor, a magnetoresistance effect sensor (MR sensor), a giant magnetoresistance effect sensor (GMR sensor), a tunneling magnetoresistance effect sensor (TMR sensor), or a fluxgate sensor.

In some embodiments, the first coil 4511, the second coil 4512, the third coil 4513, and the fourth coil 4514 respectively surround the first sensing element 4521, the second sensing element 4522, the third sensing element 4523, and the fourth sensing element 4524. Moreover, because the first sensing element 4521 and the third sensing element 4523 are arrange along the second axis 4002, the first sensing element 4521 and the third sensing element 4523 may also be used for detecting the rotation of the movable portion 4200 relative to the fixed portion 4100. The second sensing element 4522 and the fourth sensing element 4524 are also arrange along the second axis 4002, so the second sensing element 4522 and the fourth sensing element 4524 may also be used for detecting the rotation of the movable portion 4200 relative to the fixed portion 4100.

Figure 5A:
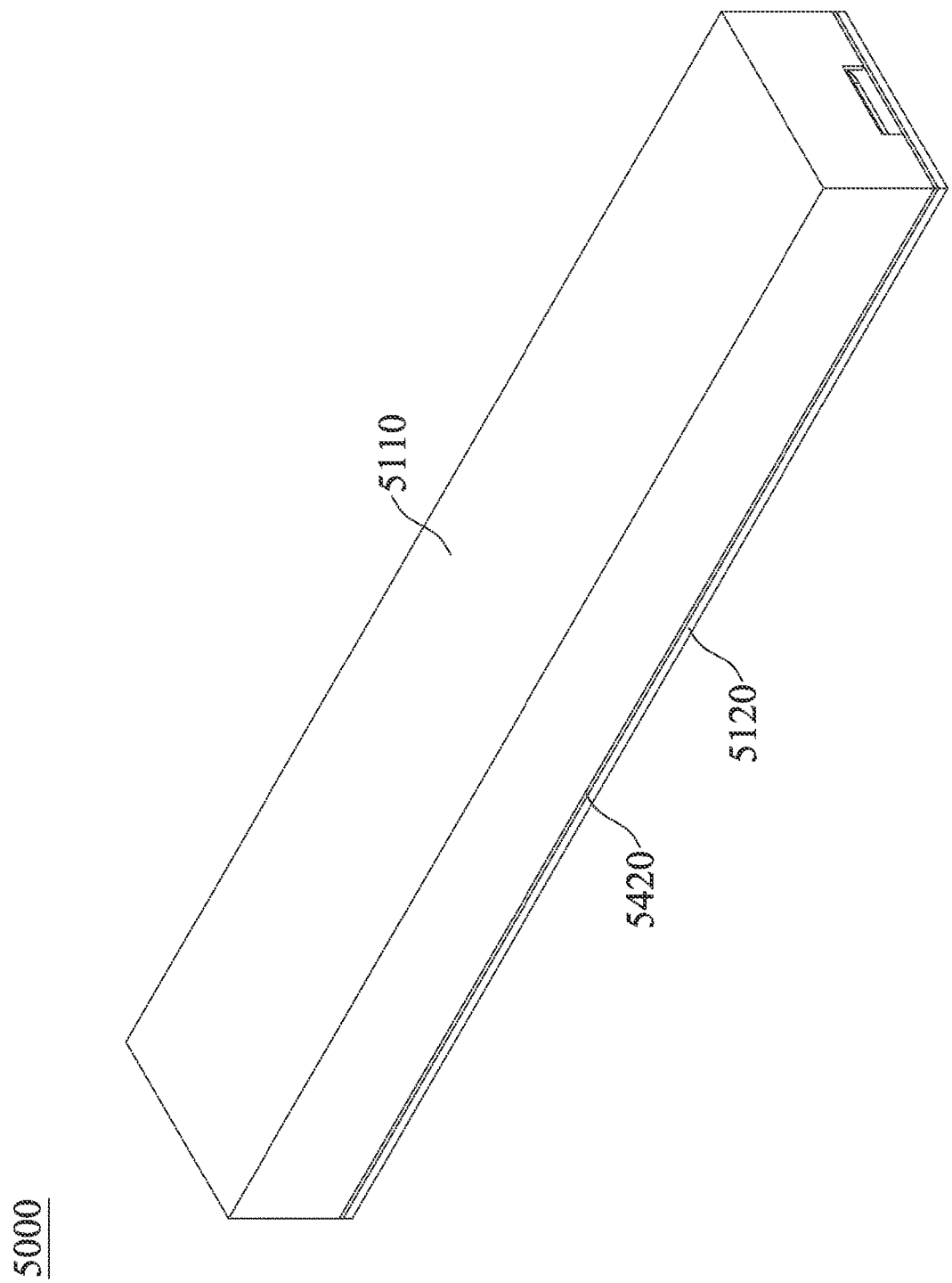
FIG. 5A is a schematic view of an optical element driving mechanism.
Figure 5B:
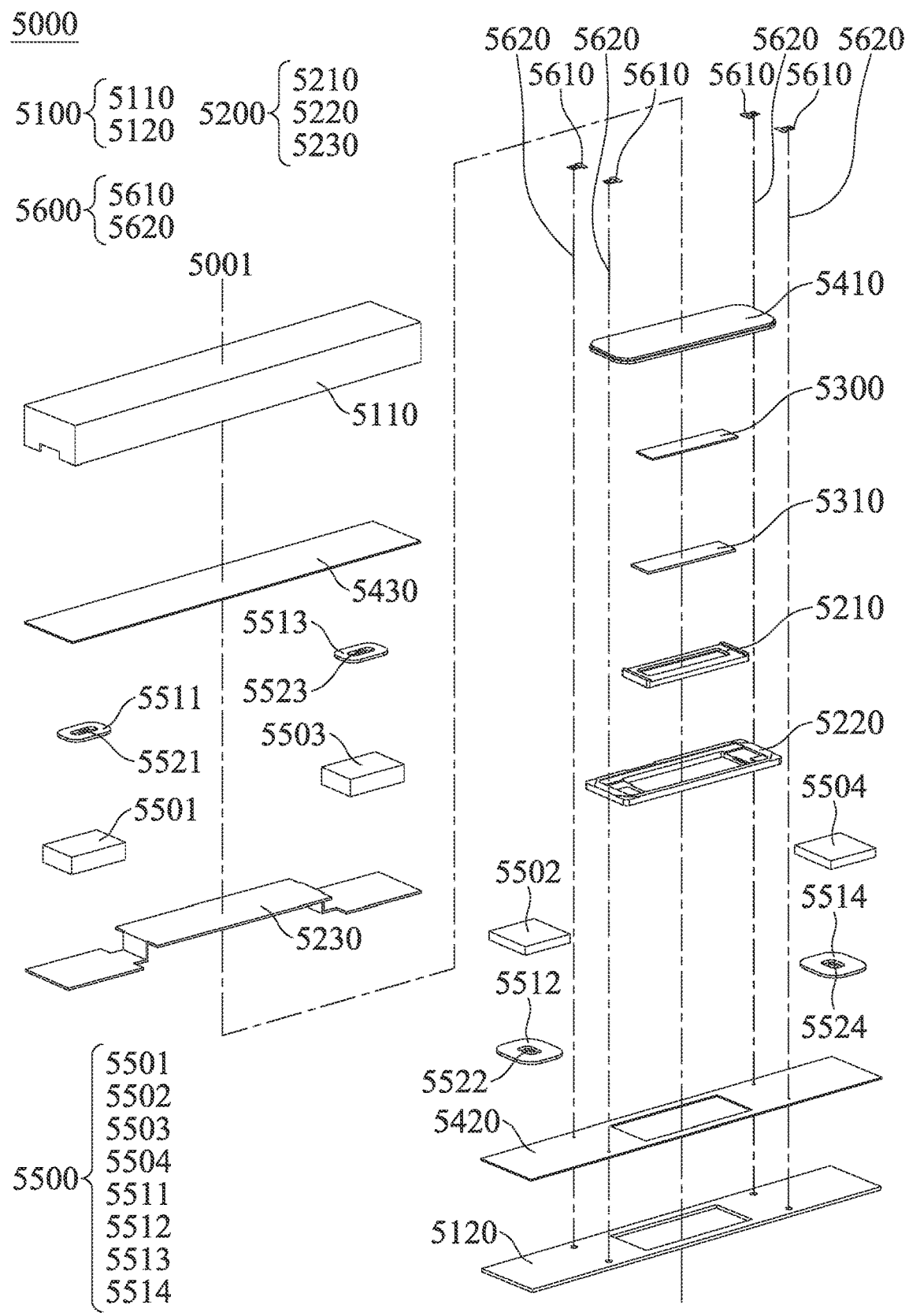
FIG. 5B is an exploded view of the optical element driving mechanism.
Figure 5C:
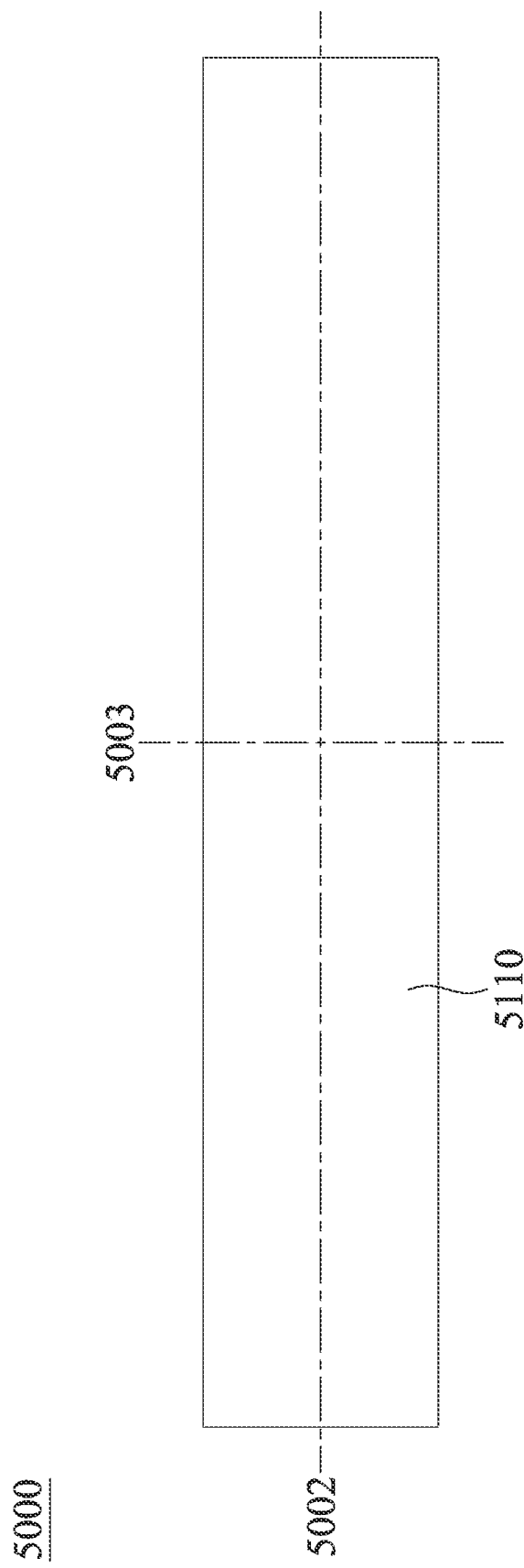
FIG. 5C is a top view of the optical element driving mechanism.
Figure 5D:
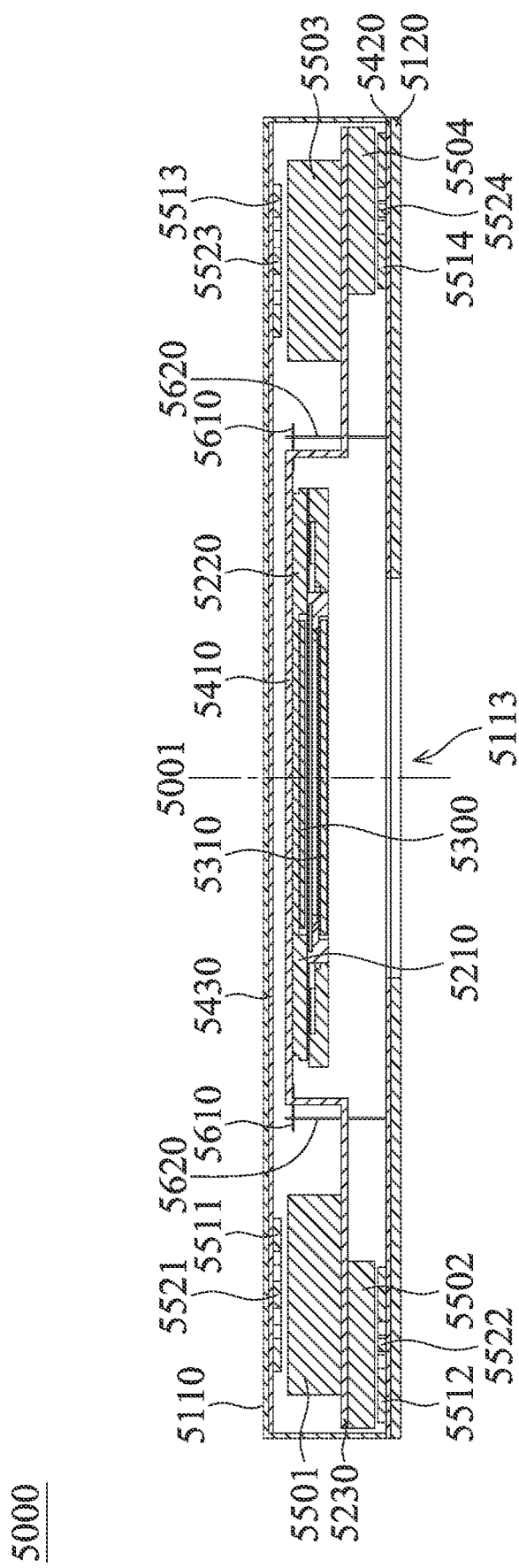
FIG. 5D is a cross-sectional view illustrated along a second axis in FIG. 5C.

FIG. 5A is a schematic view of an optical element driving mechanism 5000. FIG. 5B is an exploded view of the optical element driving mechanism 5000. FIG. 5C is a top view of the optical element driving mechanism 5000. FIG. 5D is a cross-sectional view illustrated along a second axis 5002 in FIG. 5C. The optical axis 5001, the second axis 5002, and the third axis 5003 may be perpendicular to each other and may pass through the center of the optical element driving mechanism 5000.

The optical element driving mechanism 5000 may be used for substitute the optical element driving mechanism 1100 to be disposed in the optical system 1000, and the optical element driving mechanism 5000 may include a first case 5110, a first bottom 5120, a first holder 5210, a second holder 5220, a third holder 5230, a first optical element 5300, a light filtering element 5310, a first circuit assembly 5410, a second circuit assembly 5420, a first magnetic element 5501, a second magnetic element 5502, a third magnetic element 5503, a first coil 5511, a second coil 5512, a third coil 5513, a first sensing element 5521, a second sensing element 5522, a third sensing element 5523, a first connecting element 5610, and a second connecting element 5620 arrange along the optical axis 5001.

In some embodiments, the first case 5110 and the first bottom 5120 may be called as a fixed portion 5100, the first holder 5210, the second holder 5220, and the third holder 5230 may be called as a movable portion 5200. The first magnetic element 5501, the second magnetic element 5502, the third magnetic element 5503, the fourth magnetic element 5504, the first coil 5511, the second coil 5512, the third coil 5513, and the fourth coil 5514 may be called as a driving assembly 5500. The first connecting element 5610 and the second connecting element 5620 may be called as a connecting assembly 5600.

A first opening 5113 may be formed on the first case 5110. The light filtering element 5310 may be a light filter, may be exposed from the first opening 5113 and used for filtering light with specific wavelength (e.g. infrared or UV light) to only allow light with specific wavelength to pass through, and then reach the first optical element 5300. The light filtering element 5310 may be disposed on the first holder 5210, and the first holder 5210 may be disposed on the second holder 5220. The second holder 5220 and the first optical element 5300 may be disposed on the first circuit assembly 5410. The first circuit assembly 5410 may be disposed on the third holder 5230. The third holder 5230 may be movably connected to the first bottom 5120 through the connecting assembly 5600. In other words, the movable portion 5200 may be used for holding the first optical element 5300, and may be movably connected to the fixed portion 5100 through the connecting assembly 5600. The first optical element 5300 may include an image sensor. The first connecting element 5610 of the connecting assembly 5600 may include springs, and the second connecting element 5620 of the connecting assembly 5600 may include suspension wires to movably connect the fixed portion 5100 and the movable portion 5200. In some embodiments, the optical element driving mechanism 5000 may include four first connecting element 5610 and four second connecting element 5620 disposed on four corners of the optical element driving mechanism 5000 to maintain the position of the movable portion 5200 relative to the fixed portion 5100.

Figure 5E:
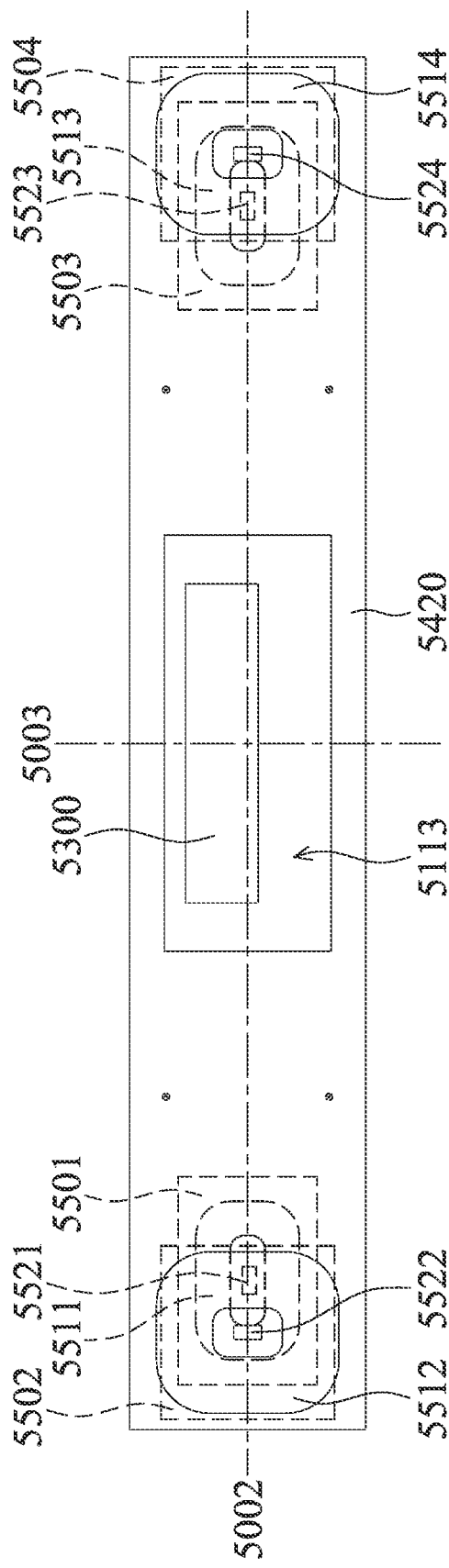
FIG. 5E is a top view of some elements of the optical element driving mechanism.

FIG. 5E is a top view of some elements of the optical element driving mechanism 5000. The first magnetic element 5501, the second magnetic element 5502, the third magnetic element 5503, and the fourth magnetic element 5504 of the driving assembly 5500 may be disposed on the third holder 5230, such as the first magnetic element 5501 and the third magnetic element 5503 may be disposed on a side of the third holder 5230 facing the first bottom 5120, and the second magnetic element 5502 and the fourth magnetic element 5504 may be disposed on another side of the third holder 5230 facing the first case 5110. The first coil 5511, the second coil 5512, the third coil 5513, and the fourth coil 5514 may be disposed on the second circuit assembly 5420. The second circuit assembly 5420 may be disposed on the first bottom 5120. The third circuit assembly 5430 may be disposed on the first case 5110. The first magnetic element 5501, the second magnetic element 5502, the third magnetic element 5503, and the fourth magnetic element 5504 may be magnets, and when current passes through the first coil 5511, the second coil 5512, the third coil 5513, and the fourth coil 5514. Afterwards, the first magnetic element 5501, the second magnetic element 5502, the third magnetic element 5503, and the fourth magnetic element 5504 may interact with the first coil 5511, the second coil 5512, the third coil 5513, and the fourth coil 5514 to generate electromagnetic driving force to move the movable portion 5200 relative to the fixed portion 5100. In some embodiments, the positions of the first magnetic element 5501, the second magnetic element 5502, the third magnetic element 5503, and the fourth magnetic element 5504 may be exchanged with the first coil 5511, the second coil 5512, the third coil 5513, and the fourth coil 5514. For example, the first magnetic element 5501, the second magnetic element 5502, the third magnetic element 5503, and the fourth magnetic element 5504 may be disposed on the fixed portion 5100, and the first coil 5511, the second coil 5512, the third coil 5513, and the fourth coil 5514 may be disposed on the movable portion 5200, depending on the design requirement.

The first magnetic element 5501 and the third magnetic element 5503 are disposed on one side of the third holder 5230, and the second magnetic element 5502 and the fourth magnetic element 5504 are disposed on another side of the third holder 5230, so the first coil 5511 and the third coil 5513 corresponding to the first magnetic element 5501 and the third magnetic element 5503 are also disposed on one side of the third holder 5230, and the second coil 5512 and the fourth coil 5514 corresponding to the second magnetic element 5502 and the fourth magnetic element 5504 are also disposed on another side of the third holder 5230. In other words, the fourth coil 5514 is between the first optical element 5300 and the first opening 5113, and the first optical element 5300 is between the first opening 5113 and the first coil 5511 in the direction that the optical axis 5001 extends. Furthermore, the first optical element 5300 is between the first coil 5511 and the third coil 5513 in the direction that the second axis 5002 extends. The first coil 5511 and the third coil 5513 are position at different height with the second coil 5512 and the fourth coil 5514. In other words, the first coil 5511 and the third coil 5513 do not overlap the second coil 5512 and the fourth coil 5514 in the direction that the second axis 5002 extends. Therefore, the first magnetic element 5501 and the third magnetic element 5503 that correspond to the first coil 5511 and the third coil 5513 do not overlap the second magnetic element 5502 and the fourth magnetic element 5504 that corresponds to the second coil 5512 and the fourth coil 5514. Therefore, the size of the optical element driving mechanism 5000 in specific directions may be reduced to achieve miniaturization.

The first sensing element 5521, the second sensing element 5522, the third sensing element 5523, and the fourth sensing element 5524 may be used for detecting the movement of the movable portion 5200 relative to the fixed portion 5100, such as a linear movement of the movable portion 5200 relative to the fixed portion 5100. The first sensing element 5521, the second sensing element 5522, the third sensing element 5523, and the fourth sensing element 5524 may include a Hall sensor, a magnetoresistance effect sensor (MR sensor), a giant magnetoresistance effect sensor (GMR sensor), a tunneling magnetoresistance effect sensor (TMR sensor), or a fluxgate sensor.

In some embodiments, the first coil 5511, the second coil 5512, the third coil 5513, and the fourth coil 5514 respectively surround the first sensing element 5521, the second sensing element 5522, the third sensing element 5523, and the fourth sensing element 5524. Moreover, because the first sensing element 5521 and the third sensing element 5523 are arrange along the second axis 5002, the first sensing element 5521 and the third sensing element 5523 may also be used for detecting the rotation of the movable portion 5200 relative to the fixed portion 5100. The second sensing element 5522 and the fourth sensing element 5524 are also arrange along the second axis 5002, so the second sensing element 5522 and the fourth sensing element 5524 may also be used for detecting the rotation of the movable portion 5200 relative to the fixed portion 5100.

Since the magnetic elements and the coils in this embodiment may overlap each other in the direction that the optical axis 5001 extends, the size of the optical element driving mechanism 5000 in other directions (e.g. the direction that the second axis 5002 extends) may be reduced to achieve miniaturization.

In summary, an optical element driving mechanism is provided in some embodiments of the present disclosure. The optical element driving mechanism includes a movable portion, a fixed portion, and a driving assembly. The movable portion is used for connecting to a first optical element having an optical axis. The movable portion is movable relative to the fixed portion. The driving assembly is used for driving the movable portion to move relative to the fixed portion. When viewed along the optical axis, the optical element driving mechanism is strip-shaped. Therefore, auto focus or optical image stabilization may be achieved, and also may reduce the size of the optical element driving mechanism.

The relative positions and size relationship of the elements in the present disclosure may allow the optical element driving mechanism achieving miniaturization in specific directions or for the entire mechanism. Moreover, different optical modules may be combined with the optical element driving mechanism to further enhance optical quality, such as the quality of photographing or accuracy of depth detection. Therefore, the optical modules may be further utilized to achieve multiple anti-vibration systems, so image stabilization may be significantly improved.

Although embodiments of the present disclosure and their advantages already have been described in detail, it should be understood that various changes, substitutions and alterations may be made herein without departing from the spirit and the scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are also intended to include within their scope of such processes, machines, manufacture, and compositions of matter, means, methods, or steps. In addition, each claim herein constitutes a separate embodiment, and the combination of various claims and embodiments are also within the scope of the disclosure.

What is claimed is:

1. An optical element driving mechanism, comprising:
   a movable portion used for connecting to a first optical element having an optical axis;
   a fixed portion, wherein the movable portion is movable relative to the fixed portion;
   a driving assembly used for driving the movable portion to move relative to the fixed portion; and
   a second circuit assembly, wherein the first optical element, the driving assembly, and the second circuit assembly overlap each other when viewed along the optical axis;
   wherein the optical element driving mechanism is strip-shaped when viewed along the optical axis.

2. The optical element driving mechanism as claimed in claim 1, wherein the optical element driving mechanism is used for disposing on an optical system, the optical system is used for receiving light passing along a first axis, and the first axis and the optical axis are not parallel;
   the fixed portion comprises:
      a first case, comprising:
         a first top wall, wherein the first top wall is plate-shaped; and
         a first side wall, wherein the first side wall is plate-shaped and perpendicular to the first top wall; and
      a first bottom comprising a first bottom plate, wherein the first bottom plate is plate-shaped and parallel to the first top wall;
   the first top wall is adjacent to a first optical module, and a second optical module comprises:
      a second case, comprising:
         a second top wall, wherein the second top wall is plate-shaped; and
         a second side wall, wherein the second side wall is plate-shaped and perpendicular to the second top wall; and
      a second bottom comprising a second bottom plate, wherein the second bottom plate is plate-shaped and parallel to the second top wall;
   wherein:
   a first surface of the first top wall faces the second side wall;
   the first top wall is parallel to the second side wall;
   a first opening of the first top wall is adjacent to the second side wall;
   a second opening of the second side wall is adjacent to the first top wall;
   the first opening is adjacent to the second opening;
   the maximum size of the first opening and the maximum size of the second opening in the first axis are different;
   a first accommodating space is formed by the first bottom and the first case and is used for accommodating the first optical element;
   the material of the first case comprises metal;
   the material of the first bottom comprises nonmetal;
   a second accommodating space is formed by the second bottom and the second case and is used for accommodating the second optical element;
   the material of the second case comprises metal;
   the material of the second bottom comprises nonmetal;
   the first bottom plate and the second bottom plate are not parallel.

3. The optical element driving mechanism as claimed in claim 2, further comprising a first circuit assembly electrically connected to the first optical element;
   wherein the first circuit assembly comprises:
      a first segment extending along a second axis;
      a second segment extending along a third axis;
      a third segment extending along the second axis;
      a fourth segment extending along the third axis;
      a fifth segment extending along the second axis;
      a sixth segment extending along the third axis; and
      a seventh segment extending along the second axis;
   wherein:
   the first optical element is movably connected to the fixed portion through the first circuit assembly;
   the first circuit assembly surrounds the movable portion when viewed along the optical axis;
   the first segment is plate-shaped;
   the second segment is plate-shaped and is not parallel to the first segment;
   a gap is formed between the second segment and the movable portion;
   a gap is formed between the second segment and the fixed portion;
   the optical element driving mechanism extends along the second axis when viewed along the optical axis;
   the second axis and the third axis are perpendicular;
   the third segment is plate-shaped and is not parallel to the first segment;
   the third segment is not parallel to the second segment;
   a gap is formed between the third segment and the movable portion;
   a gap is formed between the third segment and the fixed portion;
   the fourth segment is plate-shaped and is not parallel to the third segment;
   a gap is formed between the fourth segment and the movable portion;
   a gap is formed between the fourth segment and the fixed portion;
   the fifth segment is plate-shaped and is not parallel to the fourth segment;
   a gap is formed between the fifth segment and the movable portion;
   a gap is formed between the fifth segment and the fixed portion;
   the sixth segment is plate-shaped and is not parallel to the fifth segment;
   a gap is formed between the sixth segment and the movable portion;
   a gap is formed between the sixth segment and the fixed portion;
   the seventh segment is plate-shaped and is not parallel to the sixth segment;
   a gap is formed between the seventh segment and the movable portion;

a gap is formed between the seventh segment and the fixed portion;

the seventh segment and the fifth segment are not parallel;

the third axis and the first axis are parallel.

4. The optical element driving mechanism as claimed in claim 3, further comprising a first damping element used for absorbing the abnormal vibration of the movable portion relative to the fixed portion;

wherein:

the first damping element comprises resin;

the first damping element is in direct contact with the first circuit assembly;

the optical element driving mechanism is polygonal, and the first damping element is positioned at a first corner of the optical element driving mechanism when viewed along the optical axis;

the first damping element is in direct contact with the fixed portion;

the first damping element is in direct contact with a first bending portion of the first circuit assembly.

5. The optical element driving mechanism as claimed in claim 4, further comprising a second damping element used for absorbing the abnormal vibration of the movable portion relative to the fixed portion;

wherein:

the second damping element comprises resin;

the second damping element is in direct contact with the first circuit assembly;

the second damping element is positioned at a first edge of the optical element driving mechanism when viewed along the optical axis;

the second damping element is in direct contact with the movable portion;

the second damping element is in direct contact with the third segment of the first circuit assembly.

6. The optical element driving mechanism as claimed in claim 5, further comprising:

a connecting assembly, wherein the movable portion is movably connected to the fixed portion through the connecting assembly; and a third damping element used for absorbing the abnormal vibration of the movable portion relative to the fixed portion;

wherein:

the third damping element comprises resin;

the third damping element is in direct contact with the first circuit assembly;

the third damping element is positioned at a second corner of the optical element driving mechanism when viewed along the optical axis;

the third damping element is in direct contact with the connecting assembly;

the third damping element is in direct contact with a second bending portion of the first circuit assembly.

7. The optical element driving mechanism as claimed in claim 6, wherein the driving assembly comprises:

a first coil;

a first magnetic element corresponding to the first coil;

a second coil;

a second magnetic element corresponding to the second coil;

a third coil; and a third magnetic element corresponding to the third coil;

the optical element driving mechanism further comprises:

a first sensing element used for detecting the movement of the movable portion relative to the fixed portion;

a second sensing element used for detecting the movement of the movable portion relative to the fixed portion; and a third sensing element used for detecting the movement of the movable portion relative to the fixed portion;

wherein:

the first coil is strip-shaped when viewed along a coil axis of the first coil;

the first coil extends along the second axis when viewed along the coil axis of the first coil;

the center of the first magnetic element does not overlap the center of the first optical element when viewed along the optical axis;

the first coil and the first magnetic element are used for generating a first driving force;

the coil axis of the first coil is parallel to the coil axis of the second coil;

the second coil is strip-shaped when viewed along the coil axis of the second coil;

the first coil and the second coil extend in different directions when viewed along the coil axis of the second coil;

the second coil extends along the third axis when viewed along the coil axis of the second coil;

the second coil and the second magnetic element are used for generating a second driving force;

the third coil is strip-shaped when viewed along the coil axis of the third coil;

the third coil extends along the second axis when viewed along the coil axis of the third coil;

the coil axis of the third coil and the coil axis of a first coil are parallel;

the first coil and the third coil are arranged along the second axis when viewed along the coil axis of the third coil;

the center of the third magnetic element and the center of the first optical element do not overlap each other;

the third coil and the third magnetic element are used for generating a third driving force;

the direction of the first driving force is parallel to the direction of the third driving force;

the direction of the first driving force is perpendicular to the direction of the second driving force;

the direction of the first driving force is parallel to the third axis;

the direction of the second driving force is parallel to the second axis;

the first coil surrounds the first sensing element;

the first sensing element is used for detecting the linear movement of the movable portion relative to the fixed portion;

the second coil surrounds the second sensing element;

the second sensing element is used for detecting the linear movement of the movable portion relative to the fixed portion;

the third coil surrounds the third sensing element;

the third sensing element is used for detecting the linear movement of the movable portion relative to the fixed portion;

the first sensing element and the third sensing element are arranged along the second axis when viewed along the optical axis;

the first sensing element and the third sensing element are used for detecting the rotational movement of the movable portion relative to the fixed portion.

8. The optical element driving mechanism as claimed in claim 7, wherein:

the direction of the first driving force is opposite to the direction of the third driving force;

the first optical element is between the first opening and the first coil in the direction that the optical axis extends;

the distance between the center of the first magnetic element and the center of the first optical element is greater than the distance between the center of the second magnetic element and the center of the first optical element when viewed along the optical axis;

the first magnetic element and the second magnetic element are arranged along the second axis when viewed along the optical axis;

the first optical element is disposed between the driving assembly and the first opening in the direction that the optical axis extends;

the first coil at least partially overlaps the second coil in the direction that the second axis extends.

9. The optical element driving mechanism as claimed in claim 8, wherein:

the center of the second magnetic element and the center of the optical element do not overlap each other;

the driving assembly further comprises a fourth coil and a fourth magnetic element, and the fourth magnetic element corresponds to the fourth coil;

the coil axis of the fourth coil is parallel to the coil axis of the second coil;

the fourth coil is strip-shaped when viewed along the coil axis of the fourth coil;

the first coil and the fourth coil extend in different directions when viewed along the coil axis of the fourth coil;

the fourth coil extends along the third axis when viewed along the coil axis of the fourth coil;

the fourth coil and the fourth magnetic element are used for generating a fourth driving force;

the direction of the fourth driving force and the direction of the second driving force are parallel;

the center of the first optical axis is between the first magnetic element and the third magnetic element;

the center of the first optical axis is between the second magnetic element and the fourth magnetic element.

10. The optical element driving mechanism as claimed in claim 9, wherein:

the fourth coil is between the first optical element and the first opening in the direction that the optical axis extends;

the first optical element is between the first opening and the first coil in the direction that the optical axis extends;

the first optical element is between the first coil and the third coil in the direction that the second axis extends;

the first coil does not overlap the fourth coil in the direction that the second axis extends;

the first magnetic element and the fourth magnetic element do not overlap each other in the direction that the second axis extends.

* * * * *